US012740238B2

(12) United States Patent
Lee et al.

(10) Patent No.: US 12,740,238 B2
(45) Date of Patent: Sep. 15, 2026

(54) DISPLAY PANEL AND ELECTRONIC APPARATUS INCLUDING THE SAME

(71) Applicant: Samsung Display Co., Ltd., Yongin-Si (KR)

(72) Inventors: Jongchan Lee, Yongin-si (KR); Yuri Oh, Yongin-si (KR); Kibok Yoo, Yongin-si (KR); Donghyeok Lee, Yongin-si (KR); Jinsuk Lee, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 402 days.

(21) Appl. No.: 18/227,305

(22) Filed: Jul. 28, 2023

(65) Prior Publication Data

US 2024/0215307 A1 Jun. 27, 2024

(30) Foreign Application Priority Data

Dec. 27, 2022 (KR) ........................ 10-2022-0186372

(51) Int. Cl.
*H10K 59/121* (2023.01)
*G09G 3/3233* (2016.01)
(Continued)

(52) U.S. Cl.
CPC ......... *H10K 59/121* (2023.02); *G09G 3/3233* (2013.01); *H10K 59/1201* (2023.02); *H10K 59/65* (2023.02); *G09G 2300/0819* (2013.01); *G09G 2300/0852* (2013.01); *G09G 2300/0861* (2013.01)

(58) Field of Classification Search
CPC .. H10K 59/121; H10K 59/1201; H10K 59/65; G09G 3/3233; G09G 2300/0852; G09G 2300/0861
See application file for complete search history.

(56) References Cited

U.S. PATENT DOCUMENTS 11,049,927 B2 6/2021 Kim et al.
2020/0052051 A1 2/2020 Lee et al.
(Continued)

FOREIGN PATENT DOCUMENTS

CN 114709351 A 7/2022
KR 10-2022-0044061 A 4/2022
(Continued)

*Primary Examiner* — Anne M Hines
(74) *Attorney, Agent, or Firm* — Innovation Counsel LLP

(57) ABSTRACT

A display panel includes a substrate including an opening area, a display area surrounding at least a portion of the opening area, and an intermediate area disposed between the opening area and the display area, a light-emitting diode arranged in the display area and including a pixel electrode, an opposite electrode, and an intermediate layer disposed between the pixel electrode and the opposite electrode, an inorganic insulating layer arranged in the intermediate layer and defining a groove surrounding the opening area, and a separator arranged in the intermediate area and including a first metal layer arranged in the groove and a second metal layer arranged on the first metal layer and having a tip protruding in a direction crossing an upper surface of the inorganic insulating layer.

26 Claims, 14 Drawing Sheets

(51) Int. Cl.
*H10K 59/12* (2023.01)
*H10K 59/65* (2023.01)

(56) References Cited

U.S. PATENT DOCUMENTS

2022/0102678 A1 3/2022 Choi et al.
2022/0336568 A1 10/2022 Jin
2023/0006175 A1 1/2023 Kim et al.
2023/0232653 A1* 7/2023 Lee ........................ H10D 86/60
257/40

FOREIGN PATENT DOCUMENTS

KR 10-2022-0057434 A 5/2022
WO 2022-018846 A1 1/2022

* cited by examiner

DISPLAY PANEL AND ELECTRONIC APPARATUS INCLUDING THE SAME

CROSS-REFERENCE TO RELATED APPLICATION

This application is based on and claims priority under 35 U.S.C. § 119 to Korean Patent Application No. 10-2022-0186372, filed on Dec. 27, 2022, in the Korean Intellectual Property Office, the disclosure of which is incorporated by reference herein in its entirety.

BACKGROUND

1. Field

One or more embodiments relate to a display panel and an electronic apparatus including the same.

2. Description of the Related Art

Recently, the usage of display panels has diversified. In addition, display panels have become thinner and lighter, and thus, the range of uses of display panels has expanded.

As the area occupied by a display area in display panels has increased, various functions connected to or associated with display panels have been added. As a method of increasing the display area and adding various functions, research has been conducted to arrange various components in a portion of the display area.

SUMMARY

One or more embodiments include a display panel including a display area having an area for arranging various types of components, while having improved reliability, and an electronic apparatus including the display panel. However, this objective is an example and does not limit the scope of the disclosure.

Additional aspects will be set forth in part in the description which follows and, in part, will be apparent from the description, or may be learned by practice of the presented embodiments of the disclosure.

According to one or more embodiments, a display panel includes a substrate including an opening area, a display area surrounding at least a portion of the opening area, and an intermediate area disposed between the opening area and the display area, a light-emitting diode arranged in the display area and including a pixel electrode, an opposite electrode, and an intermediate layer disposed between the pixel electrode and the opposite electrode, an inorganic insulating layer arranged in the intermediate area and defining a groove surrounding the opening area, and a separator arranged in the intermediate area and including a first metal layer arranged in the groove and a second metal layer arranged on the first metal layer and having a tip protruding in a direction crossing an upper surface of the inorganic insulating layer.

The intermediate layer may include an emission layer arranged to correspond to the pixel electrode and a functional layer extending from the display area to the intermediate area, and a protrusion height of the tip protruding from an upper surface of the first metal layer may be greater than a sum of a thickness of the functional layer and a thickness of the opposite electrode.

The functional layer may include a first portion overlapping the second metal layer and a second portion disconnected from the first portion.

A thickness of the first metal layer may be greater than the sum of the thickness of the functional layer and the thickness of the opposite electrode.

The opposite electrode may include a first portion overlapping the second metal layer and a second portion disconnected from the first portion.

The display panel may further include a sub-metal layer arranged between the inorganic insulating layer and the separator.

The sub-metal layer may cover at least a portion of the upper surface of the inorganic insulating layer in the intermediate area.

The sub-metal layer may be arranged only on a side surface and a bottom surface of the groove.

The display panel may further include an opening arranged along a central line of the groove and formed through the sub-metal layer, the first metal layer, and the second metal layer.

The tip may include a first tip and a second tip separated from the first tip when viewed in a direction perpendicular to the substrate.

The tip may form a first angle with an upper surface of the substrate, and the first angle may be from 70 degrees to 90 degrees.

The display panel may further include an etch stopper arranged between the substrate and the separator and forming a bottom surface of the groove.

The groove and the separator may be provided in plural, the intermediate area may include a first sub-area and a second sub-area, the inorganic insulating layer may include a first inorganic insulating layer arranged in the first sub-area and having a first groove and a second inorganic insulating layer arranged in the second sub-area and having a second groove, and a first height from an upper surface of the substrate to an upper surface of the first inorganic insulating layer may be different from a second height from the upper surface of the substrate to an upper surface of the second inorganic insulating layer.

A boundary of the second groove may be arranged to overlap a boundary between the first sub-area and the second sub-area.

According to one or more embodiments, an electronic apparatus includes a display panel including an opening area, a display area surrounding at least a portion of the opening area, and an intermediate area disposed between the opening area and the display area, and a component arranged to overlap the opening area of the display panel, wherein the display panel includes a substrate, a light-emitting diode arranged on the substrate to overlap the display area and including a pixel electrode, an opposite electrode, and an intermediate layer disposed between the pixel electrode and the opposite electrode, an inorganic insulating layer arranged on the substrate to overlap the intermediate area and defining a groove surrounding the opening area, and a separator arranged on the substrate to overlap the intermediate area and including a first metal layer arranged in the groove and a second metal layer arranged on the first metal layer and having a tip protruding in a direction crossing an upper surface of the inorganic insulating layer.

The intermediate layer may include an emission layer arranged to correspond to the pixel electrode and a functional layer extending from the display area to the intermediate area, and a protrusion height of the tip protruding from an upper surface of the first metal layer may be greater than a sum of a thickness of the functional layer and a thickness of the opposite electrode.

A thickness of the first metal layer may be greater than the sum of the thickness of the functional layer and the thickness of the opposite electrode.

The functional layer may include a first portion overlapping the second metal layer and a second portion disconnected from the first portion.

The electronic apparatus may further include a sub-metal layer arranged between the inorganic insulating layer and the separator.

The sub-metal layer may cover at least a portion of the upper surface of the inorganic insulating layer in the intermediate area.

The sub-metal layer may be arranged only on a side surface and a bottom surface of the groove.

The electronic apparatus may further include an opening arranged along a central line of the groove and formed through the sub-metal layer, the first metal layer, and the second metal layer.

The tip may include a first tip and a second tip separated from the first tip when viewed in a direction perpendicular to the substrate.

The tip may form a first angle with an upper surface of the substrate, and the first angle may be from 70 degrees to 90 degrees.

The electronic apparatus may further include an etch stopper arranged between the substrate and the separator and forming a bottom surface of the groove.

The groove and the separator may be provided in plural, the intermediate area may include a first sub-area and a second sub-area, the inorganic insulating layer may include a first inorganic insulating layer arranged in the first sub-area and having a first groove and a second inorganic insulating layer arranged in the second sub-area and having a second groove, and a first height from an upper surface of the substrate to an upper surface of the first inorganic insulating layer may be different from a second height from the upper surface of the substrate to an upper surface of the second inorganic insulating layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
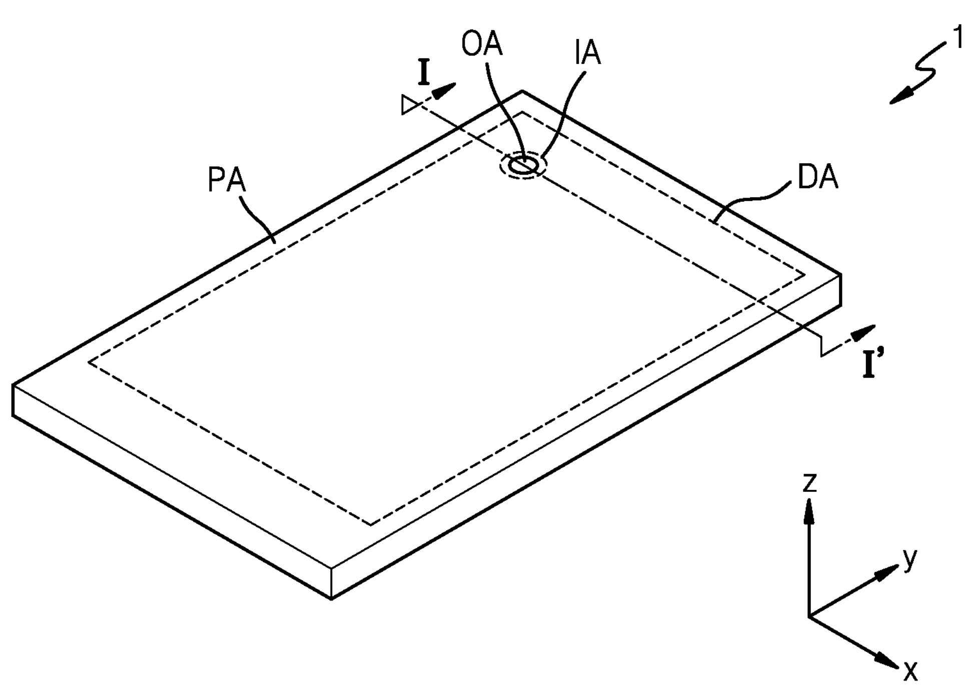
FIG. 1 is a schematic perspective view of an electronic apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While the disclosure is capable of various modifications and alternative forms, embodiments thereof are shown by way of example in the drawings and will herein be described in detail. Effects and characteristics of the disclosure, and realizing methods thereof will become apparent by referring to the drawings and embodiments described in detail below. However, the disclosure is not limited to the embodiments disclosed hereinafter and may be realized in various forms.

Hereinafter, embodiments of the disclosure will be described in detail by referring to the accompanying drawings. In descriptions with reference to the drawings, the same reference numerals are given to elements that are the same or substantially the same and descriptions will not be repeated.

It will be understood that although the terms "first," "second," etc. may be used herein to describe various components, these components should not be limited by these terms. These components are only used to distinguish one component from another.

As used herein, the singular expressions "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being formed "on" another layer, area, or element, it can be directly or indirectly formed on the other layer, region, or element. That is, for example, intervening layers, regions, or elements may be present.

In the embodiments hereinafter, it will be understood that when an element, an area, or a layer is referred to as being connected to another element, area, or layer, it can be directly and/or indirectly connected to the other element, area, or layer. For example, it will be understood in this specification that when an element, an area, or a layer is referred to as being in contact with or being electrically connected to another element, area, or layer, it can be directly and/or indirectly in contact with or electrically connected to the other element, area, or layer.

In this specification, the expression "A and/or B" may indicate A, B, or A and B. Also, the expression "at least one of A and B" may indicate A, B, or A and B.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Sizes of elements in the drawings may be exaggerated for convenience of explanation. For example, sizes and thicknesses of the elements in the drawings are randomly indicated for convenience of explanation, and thus, the disclosure is not necessarily limited to the illustrations of the drawings.

FIG. 1 is a schematic perspective view of an electronic apparatus 1 according to an embodiment.

Referring to FIG. 1, the electronic apparatus 1 may include an apparatus for displaying a video or a static image and may be used as display screens not only of portable electronic apparatuses, such as a mobile phone, a smart phone, a tablet personal computer (PC), a mobile communication terminal, an electronic notebook, an electronic book, a portable multimedia player (PMP), a navigation device, and an ultra-mobile PC (UMPC), but also of various products, such as a television, a notebook computer, a monitor, a broadcasting panel, and an Internet of things (IOT) device. Also, the electronic apparatus 1 according to an embodiment may be used in wearable devices, such as a smart watch, a watch phone, a glasses-type display, and a head-mounted display (HMD). Also, the electronic apparatus 1 according to an embodiment may be used as a center information display (CID) on an instrument panel of a vehicle or a center fascia or a dashboard of the vehicle, a room mirror display substituting a side-view mirror of a vehicle, or a display disposed on a rear surface of a front seat, as an entertainment device for a backseat of a vehicle. The electronic apparatus 1 may be bendable, foldable, or rollable. FIG. 1 illustrates that the electronic apparatus 1 according to an embodiment is used as a smartphone for convenience of explanation.

The electronic apparatus 1 may have a rectangular shape in a plan view. For example, the electronic apparatus 1 may have the rectangular planar shape having a short side in an x direction and a long side in a y direction as illustrated in FIG. 1. A corner at which the short side in the x direction and the long side in the y direction meet each other may be formed to have a predetermined curvature so as to be curved or may be formed to have a right angle. The electronic apparatus 1 in the planar shape is not limited to having the rectangular shape, but may also include other polygonal shapes, an oval shape, or an amorphous shape.

The electronic apparatus 1 may include an opening area OA (or a first area) and a display area DA (or a second area) at least partially surrounding the opening area OA. The electronic apparatus 1 may include an intermediate area IA disposed between the opening area OA and the display area DA, and a peripheral area PA surrounding an outer portion of the display area DA. Each of the intermediate area IA and the peripheral area PA may correspond to a non-display area for not emitting light.

The opening area OA may be arranged at an inner portion of the display area DA. According to an embodiment, the opening area OA may be arranged at an upper left side of the display area DA as illustrated in FIG. 1. Alternatively, the opening area OA may be arranged at various sides of the display area DA such as an upper middle side or an upper right side of the display area DA. The expression "left," "right, "upper," or "lower" with respect to the plan view of this specification indicates a direction with respect to the electronic apparatus 1 viewed in a direction perpendicular to the electronic apparatus 1. For example, the expression "left" indicates a −x direction, the expression "right" indicates a +x direction, the expression "upper" indicates a +y direction, and the expression "lower" indicates a −y direction. FIG. 1 illustrates that one opening area OA is arranged. However, according to another embodiment, a plurality of opening areas OA may be arranged.

Figure 2:
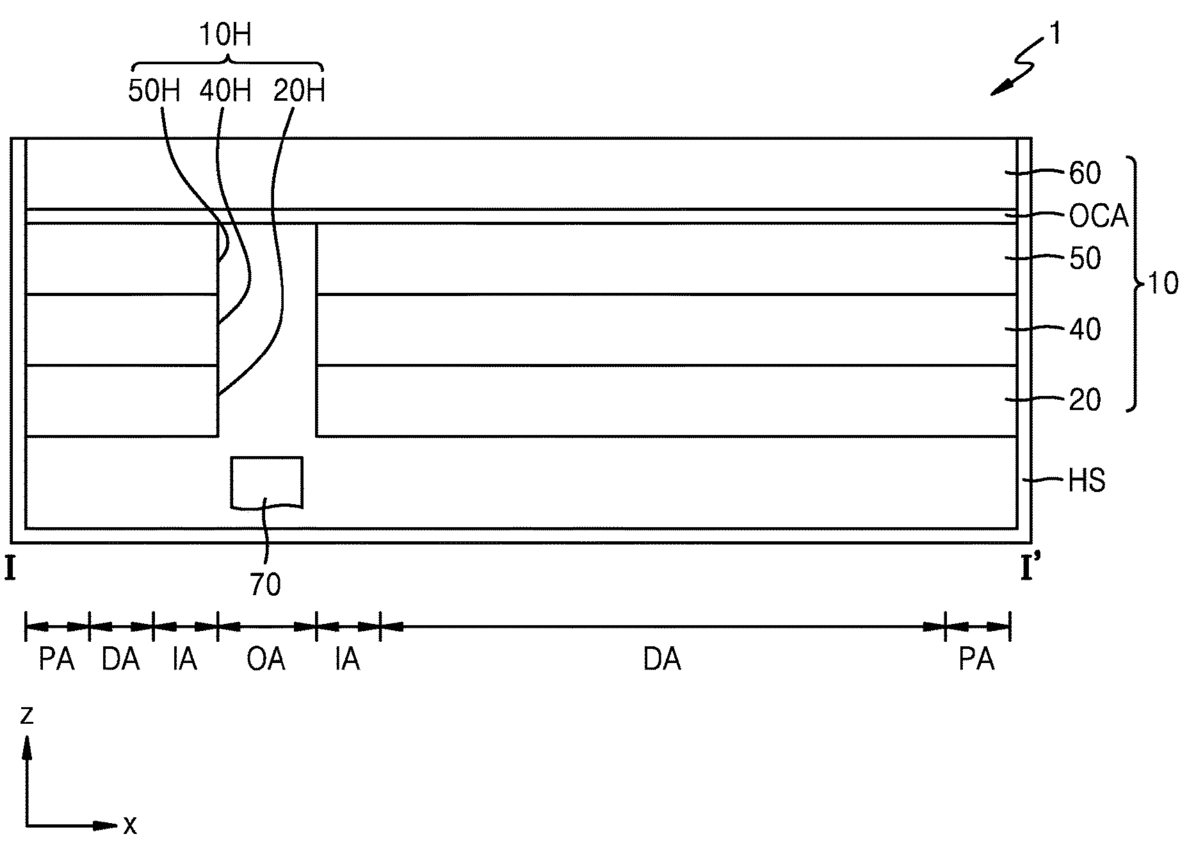
FIG. 2 is a schematic cross-sectional view of a display panel taken along line I-I' of FIG. 1, according to an embodiment.

FIG. 2 is a schematic cross-sectional view of a display panel 10 taken along line I-I' of FIG. 1, according to an embodiment.

Referring to FIG. 2, the electronic apparatus 1 may include the display panel 10 and a component 70 arranged in an area corresponding to the opening area OA of the display panel 10. The display panel 10 and the component 70 may be accommodated in a housing HS.

The display panel 10 may include a display layer 20, an input sensing layer 40, an optical functional layer 50, and a cover window 60.

The display layer 20 may include display elements (or emission elements) for emitting light to display an image and pixel circuits respectively connected to the display elements and applying electrical signals to the display elements. The display element may include a light-emitting diode, for example, an organic light-emitting diode including an organic emission layer.

The input sensing layer 40 may obtain coordinate information based on an external input, for example, a touch event. The input sensing layer 40 may include a sensing electrode (or a touch electrode) and trace lines connected to the sensing electrode (or the touch electrode). The input sensing layer 40 may be arranged above the display layer 20. The input sensing layer 40 may sense an external input by using a mutual cap method and/or a self-cap method.

The input sensing layer 40 may be directly formed on the display layer 20 or may be coupled to the display layer 20 through an adhesive layer, such as an optical clear adhesive (OCA), after being separately formed. For example, a process of forming the input sensing layer 40 may be sequentially performed after a process of forming the display layer 20, and in this case, the adhesive layer may not be arranged between the input sensing layer 40 and the display layer 20. FIG. 2 illustrates that the input sensing layer 40 is arranged between the display layer 20 and the optical functional layer 50. However, according to another embodiment, the input sensing layer 40 may be arranged above the optical functional layer 50.

The optical functional layer 50 may include a reflection prevention layer. The reflection prevention layer may reduce the reflectivity of light (external light) incident toward the display panel 10 from the outside through the cover window 60. The reflection prevention layer may include a phase retarder and a polarizer. The phase retarder may include a film-type phase retarder or a liquid crystal coating-type phase retarder. The polarizer may also include a film-type polarizer or a liquid crystal coating-type polarizer. The film-type polarizer may include an elongation-type synthetic resin film, and the liquid crystal coating-type polarizer may include liquid crystals arranged in a certain shape.

According to another embodiment, the reflection prevention layer may include a black matrix and color filters. The color filters may be arranged by taking into account a color of light emitted from each of the light-emitting diodes of the display layer 20. According to another embodiment, the reflection prevention layer may include a destructive interference structure. The destructive interference structure may include a first reflective layer and a second reflective layer arranged on different layers from each other. First reflective light and second reflective light reflected from the first reflective layer and the second reflective layer, respectively, may destructively interfere, and thus, the reflectivity of external light may be decreased.

The optical functional layer 50 may include a lens layer. The lens layer may increase the extraction efficiency of the light emitted from the display layer 20 or may reduce the color deviation. The lens layer may include a layer having a concave or convex lens shape and/or may include a plurality of layers having different refractive indexes. The optical functional layer 50 may include both of the reflection prevention layer and the lens layer described above or any one of the reflection prevention layer and the lens layer.

The display panel 10 may include an opening 10H. With respect to this aspect, FIG. 2 illustrates that the display layer 20, the input sensing layer 40, and the optical functional layer 50 include a first opening 20H, a second opening 40H, and a third opening 50H, respectively, and the first to third openings 20H, 40H, and 50H overlap each other.

The first opening 20H may penetrate from a top surface of the display layer 20 to a bottom surface of the display layer 20, the second opening 40H may penetrate from a top surface of the input sensing layer 40 to a bottom surface of the input sensing layer 40, and the third opening 50H may penetrate from a top surface of the optical functional layer 50 to a bottom surface of the optical functional layer 50.

The opening 10H of the display panel 10, for example, the first to third openings 20H, 40H, and 50H, may be arranged in the opening area OA to overlap each other. Sizes (or diameters) of the first to third openings 20H, 40H, and 50H may be the same as or different from each other.

According to another embodiment, at least one of the display layer 20, the input sensing layer 40, and the optical functional layer 50 may not include an opening. For example, any one or two selected from the display layer 20, the input sensing layer 40, and the optical functional layer 50 may not include an opening.

The cover window 60 may be arranged on the optical functional layer 50. The cover window 60 may be coupled to the optical function layer 50 through an adhesive layer, such as an OCA, arranged therebetween. The cover window 60 may include a glass material or a plastic material. For example, the cover window 60 may include an ultra-thin glass window. For example, the cover window 60 may include polyethersulfone, polyacrylate, polyether imide, polyethylene naphthalate, polyethylene terephthalate, polyphenylene sulfide, polyarylate, polyimide, polycarbonate, cellulose acetate propionate, or the like.

The opening area OA may be a type of component area (for example, a sensor area, a camera area, a speaker area, etc.), in which the component 70 for adding various functions to the electronic apparatus 1 is arranged. The component 70 may be arranged below the display panel 10 to overlap the opening 10H of the display panel 10.

The component 70 may include an electronic element. For example, the component 70 may include the electronic element using light or sound. For example, the electronic element may include a sensor configured to use light, such as an infrared sensor, a camera configured to receive light and capture an image, a sensor configured to measure a distance or recognize a fingerprint, etc. by outputting and sensing light or sound, a small lamp configured to output light, a speaker configured to output sound, etc. The electronic element using light may use pieces of light of various wavelength ranges such as visible rays, infrared rays, ultraviolet rays, etc. The opening area OA may correspond to a transmission area through which light and/or sound output from the component 70 to the outside or proceeding from the outside toward the electronic element may be transmitted.

According to another embodiment, when the electronic apparatus 1 is used as a smart watch or a vehicle dashboard, the component 70 may be a member including clock hands or hands indicating certain information (for example, a vehicle speed, etc.). In this case, the cover window 60 may include an opening arranged in the opening area OA, unlike FIG. 2, so that the component 70, such as the hands, may be exposed to the outside. Alternatively, when the electronic apparatus 1 includes the component 70, such as a speaker, the cover window 60 may also include an opening corresponding to the opening area OA.

Figure 3:
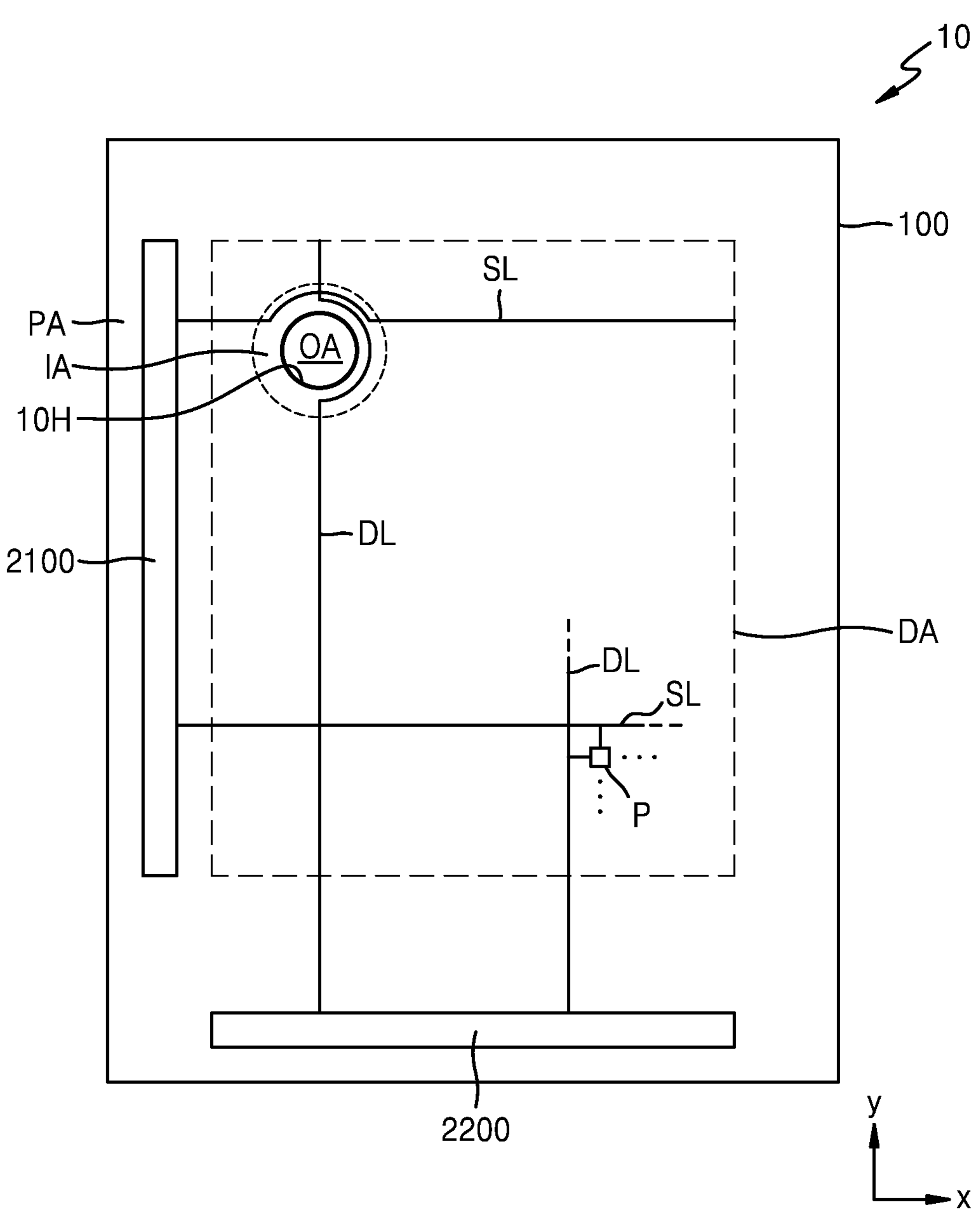
FIG. 3 is a schematic plan view of a display panel according to an embodiment.

FIG. 3 is a schematic plan view of the display panel 10 according to an embodiment.

Referring to FIG. 3, the display panel 10 may include the opening area OA, the display area DA, the intermediate area IA, and the peripheral area PA.

The display panel 10 may include a plurality of pixels P arranged in the display area DA. The pixel P may be a minimum area for emitting light and may be an area for emitting red, green, or blue light. The display panel 10 may display an image using the light emitted from a light-emitting diode of each pixel P.

Each pixel P may include an organic light-emitting diode as a display element. According to another embodiment, the display panel 10 may include an inorganic light-emitting diode rather than the organic light-emitting diode. Hereinafter, in this specification, the pixel P including the organic light-emitting diode as a display element is described. That the pixel P is arranged in the display area DA may indicate that the organic light-emitting diode OLED is arranged in the display area DA.

The intermediate area IA may surround the opening area OA. The intermediate area IA may be an area in which the display element emitting light, such as the organic light-emitting diode, is not arranged, and signal lines configured to provide signals to the pixels P arranged around the opening area OA may cross the intermediate area IA. For example, while data lines DL and/or scan lines SL may cross the display area DA in a y direction and/or an x direction as illustrated in FIG. 3, portions of the data lines DL and/or the scan lines SL may detour the intermediate area IA along an edge of the opening 10H of the display panel 10, formed in the opening area OA.

A scan driver 2100 configured to provide a scan signal to each pixel P, a data driver 2200 configured to provide a data signal to each pixel P, and a first main power line (not shown) and a second main power line (not shown) configured to provide a first power voltage and a second power voltage may be arranged in the peripheral area PA. FIG. 3 illustrates that the data driver 2200 may be arranged to be adjacent to one side of the substrate 100. However, according to another embodiment, the data driver 2200 may be arranged on a printed circuit board (PCB) electrically connected to pads arranged on a side of the display panel 10.

Figure 4A:
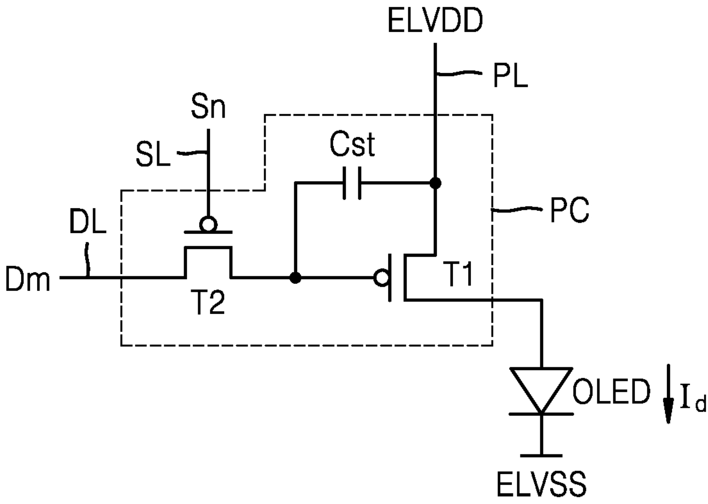
FIGS. 4A and 4B are schematic equivalent circuit diagrams of any one pixel included in a display panel according to embodiments.
Figure 4B:
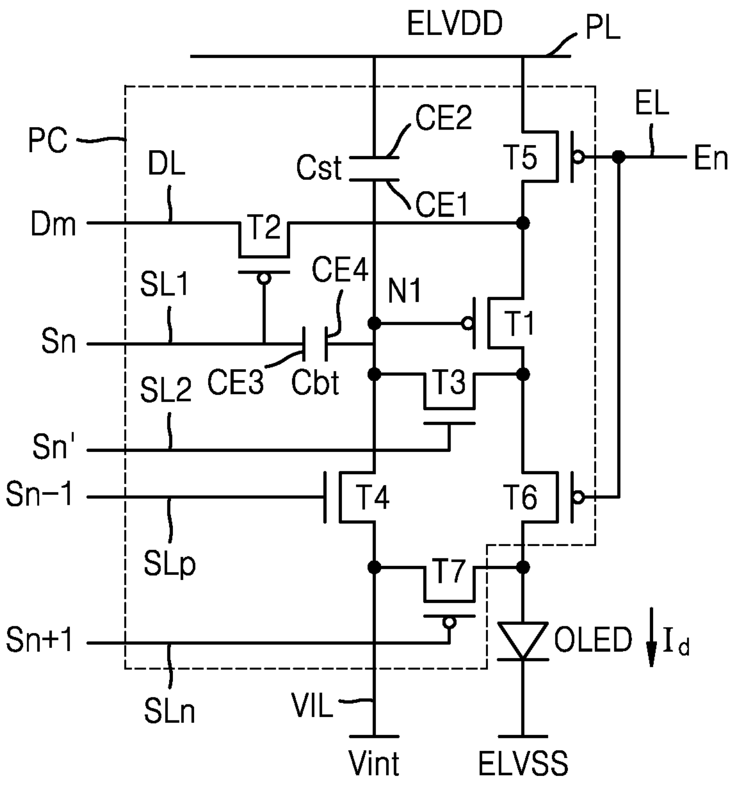

FIGS. 4A and 4B are schematic equivalent circuit diagrams of any one pixel included in a display panel according to embodiments.

Referring to FIG. 4A, each pixel P may be realized by a pixel circuit PC connected to a scan line SL, a data line DL, and a driving voltage line PL, and an organic light-emitting diode OLED connected to the pixel circuit PC. The pixel circuit PC may include a first transistor T1, a second transistor T2, and a storage capacitor Cst. The second transistor T2 may be a switching transistor. The second transistor T2 may be connected to the scan line SL and the data line DL and may be configured to transmit a data signal Dm provided through the data line DL to the first transistor T1 in response to a scan signal Sn provided through the scan line SL.

The storage capacitor Cst may be connected to the second transistor T2 and the driving voltage line PL and may be configured to store a voltage corresponding to a difference between a voltage received from the second transistor T2 and a first power voltage ELVDD (or a driving voltage) supplied to the driving voltage line PL.

The first transistor T1 may be a driving transistor. The first transistor T1 may be connected to the driving voltage line PL and the storage capacitor Cst and may be configured to control a driving current $I_d$ flowing from the driving voltage line PL through the organic light-emitting diode OLED according to a value of the voltage stored in the storage capacitor Cst. The organic light-emitting diode OLED may emit light having a certain brightness according to the driving current $I_d$.

An opposite electrode (for example, a cathode) of the organic light-emitting diode OLED may receive a second power voltage ELVSS (or a common voltage). The organic light-emitting diode OLED may emit light by receiving a driving current $I_d$ from the first transistor T1.

Referring to FIG. 4B, the pixel circuit PC may include first to seventh transistors T1, T2, T3, T4, T5, T6, and T7, a storage capacitor Cst, and a boost capacitor Cbt. According to some embodiments, the pixel circuit PC may not include the boost capacitor Cbt, and hereinafter, the pixel circuit PC including the boost capacitor Cbt will be described.

Some of the first to seventh transistors T1 to T7 may be n-channel metal-oxide semiconductor field effect transistors (n-channel MOSFET, NMOS transistors), and the others may be p-channel metal-oxide semiconductor field-effect transistors (p-channel MOSFET, PMOS transistors). For example, the third and fourth transistors T3 and T4 may be NMOS transistors, and the others may be PMOS transistors. According to another embodiment, the third, fourth, and seventh transistors T3, T4, and T7 may be NMOS transistors, and the others may be PMOS transistors. Alternatively, only one of the first to seventh transistors T1 to T7 may be an NMOS transistor and the others may be PMOS transistors.

The first to seventh transistors T1 to T7, the storage capacitor Cst, and the boost capacitor Cbt may be connected to signal lines. The signal lines may include a first scan line SL1 configured to transmit a first scan signal Sn, a second scan line SL2 configured to transmit a second scan signal Sn', a previous scan line SLp configured to transmit a previous scan signal Sn−1, an emission control line EL configured to transmit an emission control signal En, a next scan line SLn configured to transmit a next scan signal Sn+1, and a data line DL crossing the first scan line SL1 and configured to transmit a data signal Dm.

A driving voltage line PL may be configured to transmit a first power voltage ELVDD to the first transistor T1, and an initialization voltage line VIL may be configured to transmit an initialization voltage Vint for initializing a first gate electrode of the first transistor T1 and a pixel electrode of the organic light-emitting diode OLED.

The first transistor T1 may be a driving transistor. The first gate electrode (or a first control electrode) of the first transistor T1 may be connected to the storage capacitor Cst, a first electrode of the first transistor T1 may be electrically connected to the driving voltage line PL through the fifth transistor T5, and a second electrode of the first transistor T1 may be electrically connected to the pixel electrode of the organic light-emitting diode OLED through the sixth transistor T6. One of the first and second electrodes of the first transistor T1 may be a source electrode, and the other may be a drain electrode. The first transistor T1 may be configured to receive a data signal Dm according to a switching operation of the second transistor T2 and supply a driving current $I_d$ to the organic light-emitting diode OLED.

The second transistor T2 may be a switching transistor. A second gate electrode (or a second control electrode) of the second transistor T2 may be connected to the first scan line SL1, a first electrode of the second transistor T2 may be connected to the data line DL, and a second electrode of the second transistor T2 may be connected to the first electrode of the first transistor T1 and may be electrically connected to the driving voltage line PL through the fifth transistor T5. One of the first and second electrodes of the second transistor T2 may be a source electrode, and the other may be a drain electrode. The second transistor T2 may be turned on in response to the first scan signal Sn transmitted through the first scan line SL1 and may be configured to perform a switching operation of transmitting the data signal Dm transmitted through the data line DL to the first electrode of the first transistor T1.

The third transistor T3 may be a compensation transistor configured to compensate for a threshold voltage of the first transistor T1. A third gate electrode (or a compensation control electrode) of the third transistor T3 may be connected to the second scan line SL2. A first electrode of the third transistor T3 may be connected to a lower electrode CE1 of the storage capacitor Cst and the first gate electrode of the first transistor T1 through a first node N1.

The first node N1 may be an area to which the first gate electrode of the first transistor T1, the first electrode of the third transistor T3, a second electrode of the fourth transistor T4, the lower electrode CE1 of the storage capacitor Cst, and a fourth electrode CE4 of the boost capacitor Cbt are connected.

The first electrode of the third transistor T3 may be connected to the fourth transistor T4. A second electrode of the third transistor T3 may be connected to the second electrode of the first transistor T1 and may be electrically connected to the pixel electrode of the organic light-emitting diode OLED through the sixth transistor T6. One of the first and second electrodes of the third transistor T3 may be a source electrode, and the other may be a drain electrode.

The third transistor T3 may be turned on in response to the second scan signal Sn' transmitted through the second scan line SL2 and may be configured to electrically connect the first gate electrode and the second electrode of the first transistor T1 to each other to diode-connect the first transistor T1.

The fourth transistor T4 may be a first initialization transistor configured to initialize the first gate electrode of the first transistor T1. A fourth gate electrode (or a fourth control electrode) of the fourth transistor T4 may be connected to the previous scan line SLp. A first electrode of the fourth transistor T4 may be connected to the initialization voltage line VIL. A second electrode of the fourth transistor T4 may be connected to the lower electrode CE1 of the storage capacitor Cst, the first electrode of the third transistor T3, and the first gate electrode of the first transistor T1. One of the first and second electrodes of the fourth transistor T4 may be a source electrode, and the other may be a drain electrode. The fourth transistor T4 may be turned on in response to the previous scan signal Sn−1 received through the previous scan line SLp and may be configured to perform an initialization operation of initializing a voltage of the first gate electrode of the first transistor T1 by transmitting the initialization voltage Vint to the first gate electrode of the first transistor T1.

The fifth transistor T5 may be an operation control transistor. A fifth gate electrode (or a fifth control electrode) of the fifth transistor T5 may be connected to the emission control line EL, a first electrode of the fifth transistor T5 may be connected to the driving voltage line PL, and a second electrode of the fifth transistor T5 may be connected to the first electrode of the first transistor T1 and the second electrode of the second transistor T2. One of the first and second electrodes of the fifth transistor T5 may be a source electrode, and the other may be a drain electrode.

The sixth transistor T6 may be an emission control transistor. A sixth gate electrode (or a sixth control electrode) of the sixth transistor T6 may be connected to the emission control line EL, a first electrode of the sixth transistor T6 may be connected to the second electrode of the first transistor T1 and the second electrode of the third transistor T3, and a second electrode of the sixth transistor T6 may be electrically connected to a second electrode of the seventh transistor T7 and the pixel electrode of the organic light-emitting diode OLED. One of the first and second electrodes of the sixth transistor T6 may be a source electrode, and the other may be a drain electrode.

The fifth transistor T5 and the sixth transistor T6 may be simultaneously turned on in response to the emission control signal En received through the emission control line EL so that the first power voltage ELVDD may be transmitted to the organic light-emitting diode OLED, and the driving current $I_d$ may flow through the organic light-emitting diode OLED.

The seventh transistor T7 may be a second initialization transistor configured to initialize the pixel electrode of the organic light-emitting diode OLED. A seventh gate electrode (or a seventh control electrode) of the seventh transistor T7 may be connected to the next scan line SLn. A first electrode of the seventh transistor T7 may be connected to the initialization voltage line VIL. A second electrode of the seventh transistor T7 may be connected to the second electrode of the sixth transistor T6 and the pixel electrode of the organic light-emitting diode OLED. The seventh transistor T7 may be turned on in response to the next scan signal Sn+1 received through the next scan line SLn and may be configured to initialize the pixel electrode of the organic light-emitting diode OLED. FIG. 4B illustrates that the seventh transistor T7 may be connected to the next scan line SLn.

The storage capacitor Cst may include the lower electrode CE1 and an upper electrode CE2. The lower electrode CE1 of the storage capacitor Cst may be connected to the first gate electrode of the first transistor T1, and the upper electrode CE2 of the storage capacitor Cst may be connected to the driving voltage line PL. The storage capacitor Cst may be configured to store a charge corresponding to a difference between a voltage of the first gate electrode of the first transistor T1 and the first power voltage ELVDD.

The boost capacitor Cbt may include a third electrode CE3 and a fourth electrode CE4. The third electrode CE3 may be connected to the second gate electrode of the second transistor T2 and the first scan line SL1, and the fourth electrode CE4 may be connected to the first node N1. When the first scan signal Sn supplied through the first scan line SL1 is turned off, the boost capacitor Cbt may increase a voltage of the first node N1, and when the voltage of the first node N1 is increased, a black gradation may be vividly displayed.

According to an embodiment, with reference to FIG. 4B, it is described that the third and fourth transistors T3 and T4 are NMOS transistors, and the first, second, and fifth to seventh transistors T1, T2, T5 to T7 are PMOS transistors. The first transistor T1, which may directly affect the brightness of a display panel, may be provided to include a semiconductor layer including polycrystalline silicon having a high reliability, and thus, the display apparatus having a high resolution may be realized.

An oxide semiconductor may have a high carrier mobility and a low leakage current, and thus, even when a driving time is increased, a voltage drop may not be significant. That is, even during low frequency driving, a color change of an image due to a voltage drop may be insignificant. Accordingly, low frequency driving may be possible. As described above, the oxide semiconductor may have the low leakage current, and thus, at least one of the third transistor T3 and the fourth transistor T4 connected to the first gate electrode of the first transistor T1 may be formed to include the oxide semiconductor in order to prevent flowing of the leakage current to the first gate electrode of the first transistor T1 and also to reduce power consumption.

Figure 5:
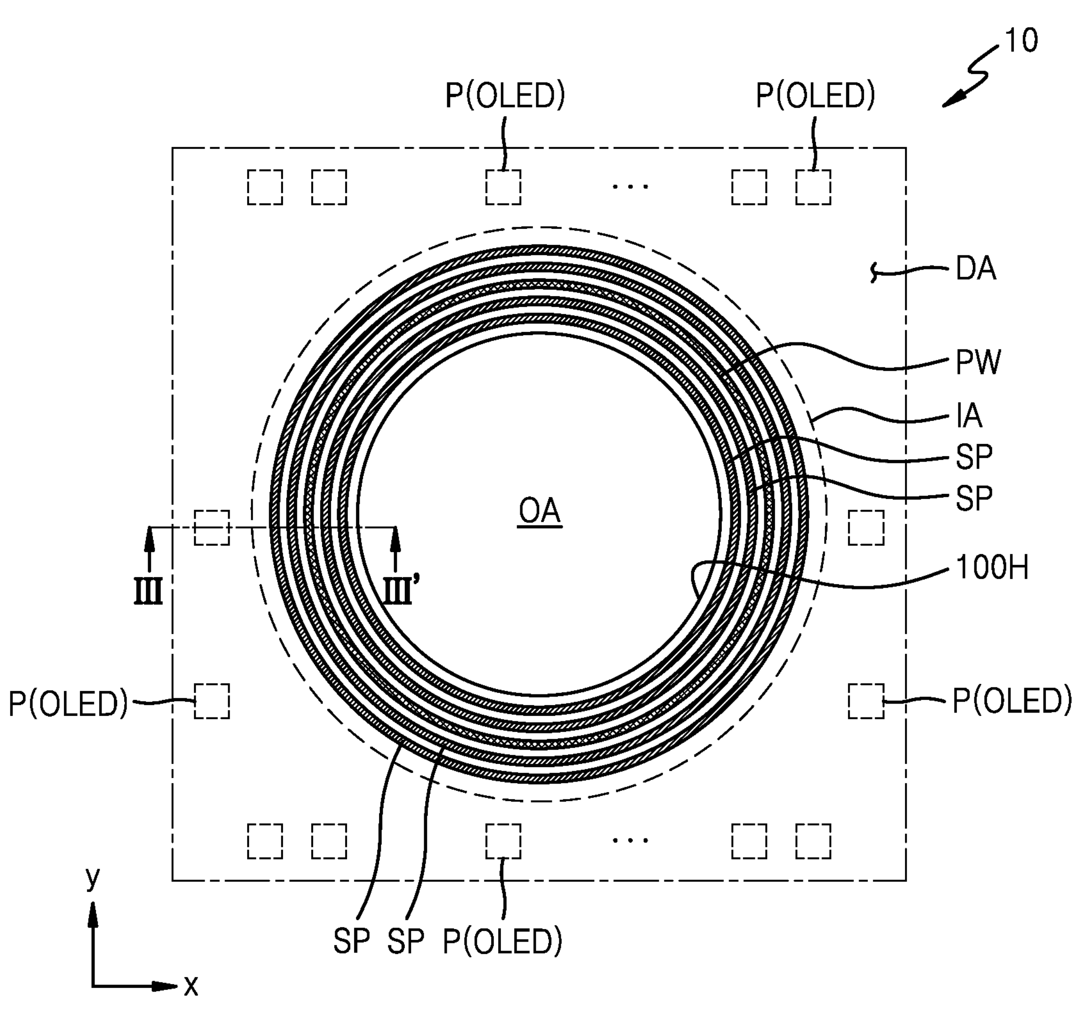
FIG. 5 is a plan view of a portion taken from a display panel according to an embodiment.

FIG. 5 is a plan view of a portion taken from a display panel according to an embodiment.

Pixels P may be arranged in the display area DA, and the intermediate area IA may be arranged between the opening area OA and the display area DA. The pixels P may be arranged in the display area DA to surround the opening area OA and the intermediate area IA.

The position of the pixel P may correspond to a position of an organic light-emitting diode OLED. That the pixel P is arranged in the display area DA may indicate that the organic light-emitting diode OLED is arranged in the display area DA.

The pixels P adjacent to the opening area OA may be arranged to be spaced apart from each other with respect to the opening area OA in a plan view. The pixels P may be arranged to be spaced apart from each other in an upper or lower direction with respect to the opening area OA or in a left or right direction with respect to the opening area OA.

Separators SP may be arranged in the intermediate area IA to be apart from each other. Each separator SP may have a closed-loop shape in a plan view (for example, when viewed in a direction approximately perpendicular to an upper surface of the substrate 100). According to some embodiments, the separators SP may be arranged to form a concentric circle as illustrated in FIG. 5.

At least one partition wall PW may be arranged in the intermediate area IA. The partition wall PW may have a closed-loop shape in a plan view. According to some embodiments, FIG. 5 illustrates that one partition wall PW may be arranged in the intermediate area IA. However, according to another embodiment, at least two partition walls PW may be arranged in the intermediate area IA to be apart from each other.

The separators SP may be arranged between the display area DA and the partition wall PW and/or between the partition wall PW and the opening area OA. According to some embodiments, FIG. 5 illustrates that two separators SP may be arranged between the display area DA and the partition wall PW, and two separators SP may be arranged between the partition wall PW and the opening area OA. However, the disclosure is not limited thereto. According to another embodiment, one separator SP, or three or more separators SP may be arranged between the display area DA and the partition wall PW. One separator SP, or three or more separators SP may be arranged between the partition wall PW and the opening area OA.

The substrate 100 of the display panel 10 may include a via-hole 100H corresponding to the opening area OA, and thus, in this specification, the opening area OA may indicate the via-hole 100H of the substrate 100. For example, that the separators SP are arranged between the partition wall PW and the opening area OA may indicate that the separators SP are arranged between the partition wall PW and the via-hole 100H.

Figure 6:
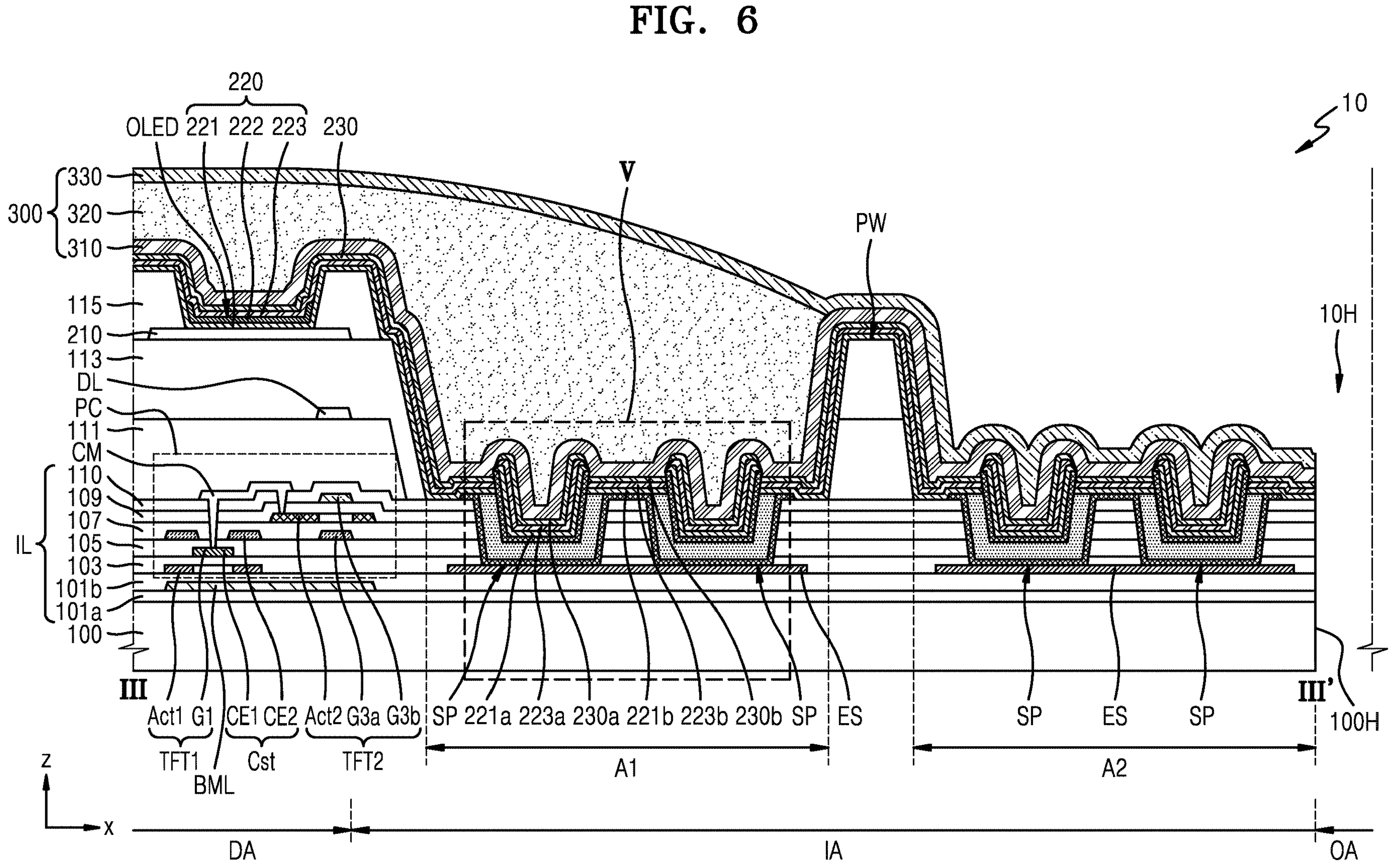
FIG. 6 is a cross-sectional view of a portion of a display panel taken along line III-III' of FIG. 5, according to an embodiment.
Figure 7:
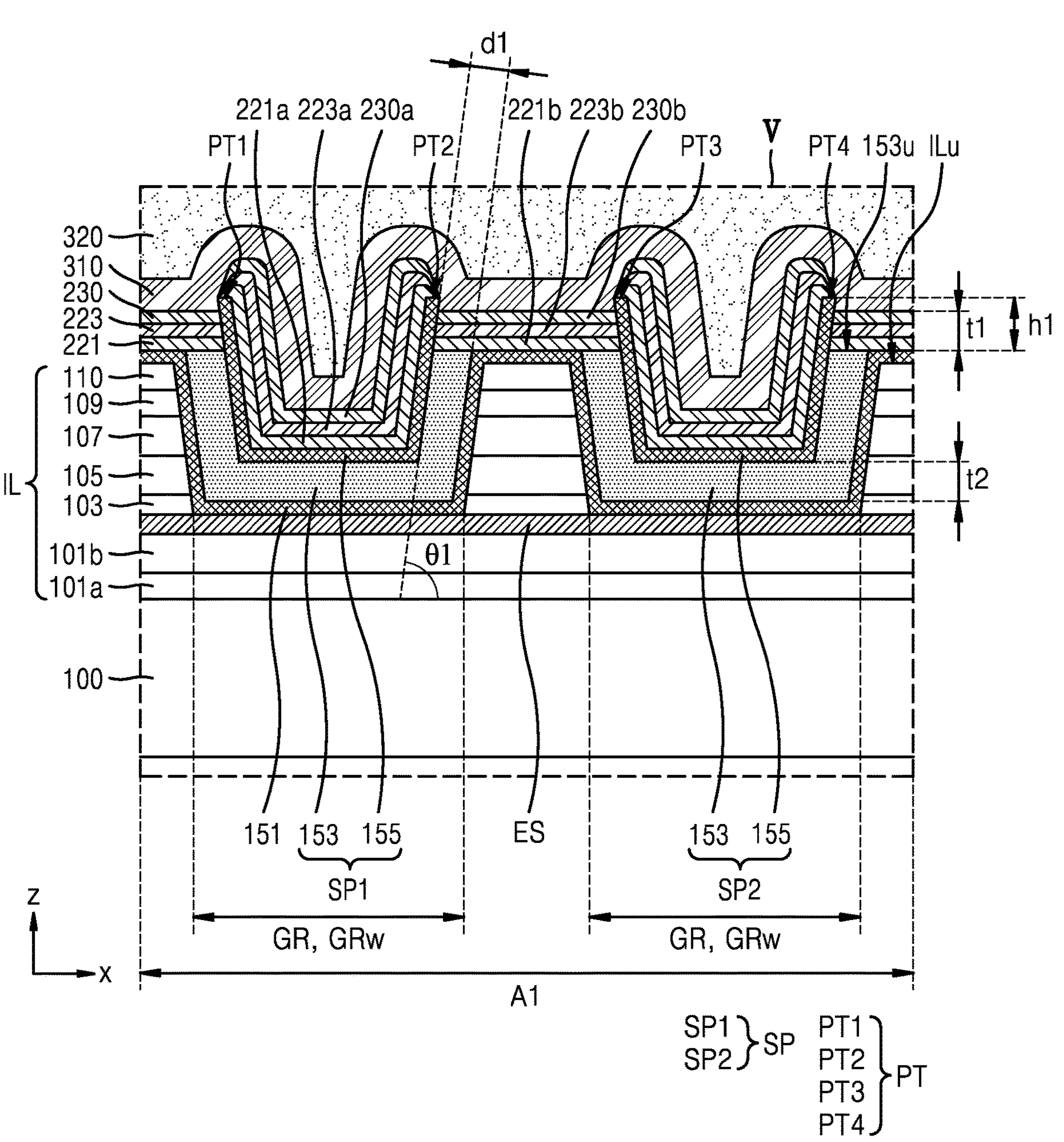
FIG. 7 is a cross-sectional view of a portion taken from a display panel and indicated by region V of FIG. 6, according to an embodiment.

FIG. 6 is a cross-sectional view of a portion of a display panel, taken along line III-III' of FIG. 5, according to an embodiment, and FIG. 7 is a cross-sectional view of a portion taken from a display panel and indicated by region V of FIG. 6, according to an embodiment. FIG. 7 illustrates a structure of the separators SP arranged in a first area A1 between the display area DA and the partition wall PW. However, the separators SP arranged in a second area A2 between the partition wall PW and the opening area OA may also have the same structure as the separators SP arranged in a first area A1 between the display area DA and the partition wall PW.

Referring to FIG. 6, the display panel 10 may include the display area DA, the opening area OA, and the intermediate area IA disposed therebetween. The display panel 10 may include a substrate 100 on which elements of the display panel 10 are arranged, and it may be understood that the substrate 100 may include the display area DA, the opening area OA, and the intermediate area IA disposed therebetween.

A pixel circuit PC may be arranged in the display area DA on the substrate 100, and an organic light-emitting diode OLED electrically connected to the pixel circuit PC may be arranged on the pixel circuit PC.

The substrate 100 may include glass materials or polymer resins. For example, the polymer resins may include polyethersulfone, polyacrylate, polyether imide, polyethylene naphthalate, polyethylene terephthalate, polyphenylene sulfide, polyarylate, polyimide, polycarbonate, cellulose acetate propionate, or the like. The substrate 100 including the polymer resins may be flexible, rollable, or bendable. The substrate 100 may have a multi-layered structure including a layer including the polymer resins described above and an inorganic layer (not shown).

A first buffer layer 101*a* and a second buffer layer 101*b* may be arranged on an upper surface of the substrate 100. The first buffer layer 101*a* and the second buffer layer 101*b* may prevent the penetration of impurities into a first semiconductor layer Act1 of the pixel circuit PC. The first and second buffer layers 101*a* and 101*b* may include an inorganic insulating material such as silicon nitride, silicon oxynitride, and silicon oxide, and may include a single layer or multi-layers including the inorganic insulating material described above.

A bottom metal layer BML may be arranged between the first and second buffer layers 101*a* and 101*b* to overlap active layers, for example, semiconductive layers. The bottom metal layer BML may block external light from reaching a first thin-film transistor TFT1 and/or a second thin-film transistor TFT2. According to some embodiments, a constant voltage or signal may be applied to the bottom metal layer BML to prevent damage to the pixel circuit PC due to an electrostatic discharge. FIG. 6 illustrates that one bottom metal layer BML may be arranged below the pixel circuit PC. However, according to some embodiments, there may be a plurality of bottom metal layers BML. The bottom metal layer BML may include a metal material. For example, the bottom metal layer BML may include Al, Pt, Pd, Ag, Mg, Au, Ni, Nd, Ir, Cr, Ca, Mo, Ti, W, and/or Cu and may include a single layer or multi-layers including the material described above.

The pixel circuit PC may be arranged on the second buffer layer 101*b*. The pixel circuit PC may include a plurality of transistors and a storage capacitor Cst, and with respect to this aspect, FIG. 6 illustrates the first thin-film transistor TFT1 and the second thin-film transistor TFT2.

The first thin-film transistor TFT1 may include the first semiconductor layer Act1 on the second buffer layer 101*b* and a first gate electrode G1 overlapping a channel area of the first semiconductor layer Act1. The first semiconductor layer Act1 may include a silicon-based semiconductor material, for example, polysilicon. The first semiconductor layer Act1 may include the channel area and impurity areas arranged at both sides of the channel area. Any one of the impurity areas arranged at the both sides of the channel area may be a source area and the other may be a drain area.

A first gate insulating layer 103 may be arranged between the first semiconductor layer Act1 and the first gate electrode G1. The first gate insulating layer 103 may include an inorganic insulating material such as silicon oxide, silicon nitride, and silicon oxynitride, and may include a single-layered or multi-layered structure including the inorganic insulating material described above.

The first gate electrode G1 may include a conductive material including Mo, Al, Cu, Ti, etc. and may include a single-layered or multi-layered structure including the material described above.

The storage capacitor Cst may include a lower electrode CE1 and an upper electrode CE2 overlapping each other. According to an embodiment, the lower electrode CE1 of the storage capacitor Cst may correspond to the first gate electrode G1 of the first thin-film transistor TFT1. For example, the first gate electrode GE1 of the first thin-film transistor TFT1 may be integrally formed with the lower electrode CE1 of the storage capacitor Cst.

The upper electrode CE2 of the storage capacitor Cst may include a conductive material including Mo, Al, Cu, Ti, etc. and may include a single-layered or multi-layered structure including the material described above.

A first interlayer insulating layer 105 may be arranged between the lower electrode CE1 and the upper electrode CE2 of the storage capacitor Cst, and a second interlayer insulating layer 107 may be arranged on the upper electrode CE2 of the storage capacitor Cst. Each of the first and second interlayer insulating layers 105 and 107 may include an inorganic insulating material such as silicon oxide, silicon nitride, and silicon oxynitride, and may include a single-layered or multi-layered structure including the inorganic insulating material described above.

A second semiconductor layer Act2 of the second thin-film transistor TFT2 may be arranged on the second interlayer insulating layer 107. The second semiconductor layer Act2 may include an oxide-based semiconductor material. For example, the second semiconductor layer Act2 may include a Zn oxide-based material, for example, a Zn oxide, an In—Zn oxide, a Ga—In—Zn oxide, etc. According to some embodiments, the second semiconductor layer Act2 may include a semiconductor including In—Ga—Zn—O (IGZO), In—Sn—Zn—O (ITZO), or In—Ga—Sn—Zn—O (IGTZO), in which a metal, such as In, Ga, or Sn, is included in ZnO.

According to some embodiments, the second thin-film transistor TFT2 may have a dual-gate structure including a lower gate electrode G3*a* and an upper gate electrode G3*b* overlapping a channel area of the second semiconductor layer Act2. According to some embodiments, the lower gate electrode G3*a* may be omitted.

The lower gate electrode G3*a* may be arranged on the same layer as the upper electrode CE2 of the storage capacitor Cst. For example, the lower gate electrode G3*a* may be arranged between the first interlayer insulating layer 105 and the second interlayer insulating layer 107. The lower gate electrode G3*a* may include the same material as the upper electrode CE2 of the storage capacitor Cst.

The upper gate electrode G3*b* may be arranged on the second semiconductor layer Act2 with a second gate insulating layer 109 disposed therebetween. The upper gate electrode G3*b* may include a conductive material including Mo, Al, Cu, Ti, etc. and may include a single-layered or multi-layered structure including the material described above. The second gate insulating layer 109 may include an inorganic insulating material such as silicon oxide, silicon nitride, and silicon oxynitride, and may include a single-layered or multi-layered structure including the inorganic insulating material described above.

A third interlayer insulating layer 110 may be arranged on the upper gate electrode G3*b*. The third interlayer insulating layer 110 may include an inorganic insulating material, such as silicon oxide, silicon nitride, and silicon oxynitride, and may include a single-layered or multi-layered structure including the inorganic insulating material described above.

FIG. 6 illustrates that the upper electrode CE2 of the storage capacitor Cst may be arranged on the same layer as the lower gate electrode G3*a* of the second thin-film transistor TFT2. However, the disclosure is not limited thereto. According to another embodiment, the upper electrode CE2 of the storage capacitor Cst may be arranged on the same layer as the second semiconductor layer Act2 of the second thin-film transistor TFT2.

The first thin-film transistor TFT1 and the second thin-film transistor TFT2 may be electrically connected to each other through a connection electrode CM. The connection electrode CM may be arranged on the third interlayer insulating layer 110. A side of the connection electrode CM may be connected to the first gate electrode G1 of the first thin-film transistor TFT1, and the other side of the connection electrode CM may be connected to the second semiconductor layer Act2 of the second thin-film transistor TFT2.

The connection electrode CM may include a conductive material including Mo, Al, Cu, Ti, etc. and may include a single-layered or multi-layered structure including the material described above. For example, the connection electrode CM may have a multi-layered structure including Ti/Al/Ti layers.

A first planarization layer 111 may be arranged on the connection electrode CM. According to some embodiments, the first planarization layer 111 may include an organic insulating material. The organic insulating material may include acryl, benzocyclobutene (BCB), polyimide, and/or hexamethyldisiloxane (HMDSO).

Signal lines, such as a data line DL, etc., may be arranged on the first planarization layer 111 and may be covered by a second planarization layer 113. FIG. 6 illustrates that the data line DL may be formed on the first planarization layer 111. However, the disclosure is not limited thereto. The data line DL may be arranged on the same layer as the connection electrode CM, for example, on the third interlayer insulating layer 110.

The data line DL may include a conductive material including Mo, Al, Cu, Ti, etc. and may include a single-layered or multi-layered structure including the material described above. For example, the data line DL may have a multi-layered structure including Ti/Al/Ti layers.

The second planarization layer 113 may include an organic insulating material. The organic insulating material may include acryl, BCB, polyimide, or HMDSO.

The organic light-emitting diode OLED may include a pixel electrode 210, an intermediate layer 220 disposed on the pixel electrode 210, and an opposite electrode 230 disposed on the intermediate layer 220.

The pixel electrode 210 may be arranged on the second planarization layer 113. The pixel electrode 210 may include a reflective layer including Ag, Mg, Al, Pt, Pd, Au, Ni, Nd, Ir, Cr, or a compound thereof. According to another embodiment, the pixel electrode 210 may further include a conductive oxide layer disposed above and/or below the reflection layer described above. The conductive oxide layer may include indium tin oxide (ITO), indium zinc oxide (IZO), zinc oxide (ZnO), indium oxide ($In_2O_3$), indium gallium oxide (IGO), and/or aluminum zinc oxide (AZO). According to an embodiment, the pixel electrode 210 may have a tri-layered structure of ITO/Ag/ITO layers.

An edge of the pixel electrode 210 may overlap a bank layer 115. The bank layer 115 may include a pixel opening overlapping a portion of the pixel electrode 210. The bank layer 115 may include an organic insulating material such as acryl, BCB, polyimide, or HMDSO. According to some embodiments, the bank layer 115 may include a light-shielding material. The light-shielding material may include a resin or paste including carbon black, a carbon nano-tube, and a black dye, a metal particle, such as Ni, Al, Mo, and an alloy thereof, a metal oxide particle (for example, chromium oxide), a metal nitride particle (for example, chromium nitride), or the like.

The intermediate layer 220 may include an emission layer 222 disposed in an emission opening of the bank layer 115 and overlapping the pixel electrode 210 through the emission opening of the bank layer 115. The emission layer 222 may include a high molecular-weight or low molecular-weight organic material emitting red, green, or blue light. According to some embodiments, the emission layer 222 may include an inorganic material or quantum dots.

The intermediate layer 220 may include a first functional layer 221 and/or a second functional layer 223. The first functional layer 221 may include a hole transport layer (HTL) and/or a hole injection layer (HIL). The second functional layer 223 may include an electron transport layer (ETL) and/or an electron injection layer (EIL).

According to some embodiments, the emission layer 222 may be patterned to correspond to the pixel electrode 210, and the first functional layer 221 and/or the second functional layer 223 may be integrally provided throughout the entire surface of the display area DA. In this case, the first functional layer 221 and the second functional layer 223 may extend to the intermediate area IA.

The opposite electrode 230 may include a conductive material having a low work function. For example, the opposite electrode 230 may include a (semi-) transparent layer including Ag, Mg, Al, Pt, Pd, Au, Ni, Nd, Ir, Cr, Li, Ca, or an alloy thereof. Alternatively, the opposite electrode 230 may further include a layer, such as ITO, IZO, ZnO, or $In_2O_3$, on the (semi-) transparent layer including the material described above.

An encapsulation layer 300 may be arranged on the organic light-emitting diode OLED and may encapsulate the organic light-emitting diode OLED. The encapsulation layer 300 may include an inorganic encapsulation layer and an organic encapsulation layer. According to an embodiment, FIG. 6 illustrates that the encapsulation layer 300 may include a first inorganic encapsulation layer 310, a second inorganic encapsulation layer 330, and an organic encapsulation layer 320 disposed therebetween.

The first and second inorganic encapsulation layers 310 and 330 may include one or more inorganic materials from among aluminum oxide ($Al_2O_3$), titanium oxide (TiO), tantalum oxide ($Ta_2O_5$), hafnium oxide ($HfO_2$), ZnO, $SiO_x$, $SiN_x$, and SiON. The first and second inorganic encapsulation layers 310 and 330 may include a single layer or multi-layers including the materials described above.

The organic encapsulation layer 320 may include a polymer-based material. The polymer-based material may include acryl-based resins, epoxy-based resins, polyimide, polyethylene, etc. According to an embodiment, the organic encapsulation layer 320 may include acrylate.

Insulating layers including an inorganic insulating material, stacked on the substrate 100, may be referred to as an inorganic insulating layer IL. For example, FIG. 6 illustrates that the inorganic insulating layer IL may include the first buffer layer 101*a* to the third interlayer insulating layer 110. However, the disclosure is not limited thereto. For example, some of the first buffer layer 101*a*, the second buffer layer 101*b*, the first gate insulating layer 103, the first interlayer insulating layer 105, the second interlayer insulating layer 107, the second gate insulating layer 109, and the third interlayer insulating layer 110 may be omitted.

With respect to the intermediate area IA of FIG. 6, at least a portion of the inorganic insulating layer IL of the display area DA may extend toward the via-hole 100H of the substrate 100. In other words, at least a portion of the inorganic insulating layer IL may be arranged in the display area DA and the intermediate area IA. For example, an edge of the inorganic insulating layer IL toward the opening area OA may be arranged on substantially the same vertical line as an edge of the substrate 100 defining the via-hole 100H.

An edge of the first planarization layer 111 and an edge of the second planarization layer 113 may be arranged in the intermediate area IA. For example, the edge of the first planarization layer 111 and the edge of the second planarization layer 113 may be arranged between the separator SP disposed most adjacent to the display area DA from among the separators SP arranged in the intermediate area IA and the display area DA.

The intermediate are IA may include a first area A1 disposed between the edge of the second planarization layer 113 and the partition wall PW, and a second area A2 disposed between the partition wall PW and the via-hole 100H.

According to some embodiments, an etch stopper ES surrounding the opening area OA may be arranged in the first area A1 and the second area A2. The etch stopper ES may define a bottom surface of a groove GR when forming the groove GR by etching a portion of the inorganic insulating layer IL. The etch stopper ES may be arranged on the same layer as the bottom metal layer BML, the first semiconductor layer Act1 of the first thin-film transistor TFT1, the first gate electrode G1 of the first thin-film transistor TFT1, the second semiconductor layer Act2 of the second thin-film transistor TFT2, or the upper gate electrode G3*b* of the second thin-film transistor TFT2. With respect to this aspect, FIG. 6 illustrates that the etch stopper ES may be arranged on the same layer as the first semiconductor layer Act1 of the first thin-film transistor TFT1 which include a silicon-based semiconductor material.

According to some embodiments, the plurality of separators SP may be arranged on one etch stopper ES, as illustrated in FIGS. 6 and 7. However, the disclosure is not limited thereto. For example, the etch stopper ES may be provided in plural in each of the first area A1 and the second area A2. The plurality of etch stoppers ES may be arranged on the same layer as each other or different layers from each other.

The inorganic insulating layer IL may have one or more grooves GR surrounding the opening area OA in the first area A1, as illustrated in FIG. 7. In this specification, the groove GR may denote an area where a portion of the inorganic insulating layer IL is removed in a lower direction (a −z direction, for example, a thickness direction). In other words, the inorganic insulating layer IL may define one or more grooves GR surrounding the opening area OA. For example, FIG. 7 illustrates that portions of the first gate insulating layer 103, the first interlayer insulating layer 105, the second interlayer insulating layer 107, the second gate insulating layer 109, and the third interlayer insulating layer 110 may be removed to form a side surface of the groove GR, and the etch stopper ES may form a bottom surface of the groove GR. In a plan view, the grooves GR may have a closed-loop shape and may be arranged to be spaced apart from each other.

A first sub-metal layer 151 may be arranged in the first area A1 to cover an upper surface ILu of the inorganic insulating layer IL and an inner surface and the bottom surface of the groove GR. The first sub-metal layer 151 may include a conductive material. Here, the conductive material may include metal and/or transparent conductive oxide. For example, the first sub-metal layer 151 may include at least one selected from Ti, Mo, and W. According to another embodiment, the first sub-metal layer 151 may include a transparent conductive oxide, such as ITO. According to some embodiments, the first sub-metal layer 151 may be omitted.

The separators SP may be arranged on the first sub-metal layer 151. For example, a first separator SP1 and a second separator SP2 may be arranged to respectively correspond to the grooves GR arranged in the first area A1 to be spaced apart from each other.

Each of the first and second separators SP1 and SP2 may include a first metal layer 153 and a second metal layer 155 arranged on the first metal layer 153 in the groove GR. Each of the first and second metal layers 153 and 155 may include a conductive material. The first metal layer 153 may include the conductive material different from the conductive material included in the first sub-metal layer 151 and the second metal layer 155.

According to some embodiments, the first metal layer 153 may include metal. For example, the first metal layer 153 may include at least one selected from Cu, Al, Pt, Pd, Ag, Mg, Au, Ni, Nb, Ir, Cr, Li, Ca, and Mo.

The second metal layer 155 may include metal and/or transparent conductive oxide. According to an embodiment, the second metal layer 155 may include at least one selected from Ti, Mo, and W. According to another embodiment, the second metal layer 155 may include a transparent conductive oxide, such as ITO. According to some embodiments, the second metal layer 155 may include the same material as the first sub-metal layer 151.

According to some embodiments, the first sub-metal layer 151 and the separators SP may be formed together in the same process as any one of the connection electrode CM, the data line DL, and the pixel electrode 210 described with reference to FIG. 6. For example, when the first sub-metal layer 151 and the first metal layer 153 and the second metal layer 155 of the separators SP form a tri-layered structure, the connection electrode CM, the data line DL, or the pixel electrode 210 may also have a tri-layered structure. According to another embodiment, when the first sub-metal layer 151 is omitted, the connection electrode CM, the data line DL, or the pixel electrode 210 may have a bi-layered structure.

The first metal layer 153 of each of the first and second separators SP1 and SP2 may be formed to have a predetermined thickness along a side wall and a bottom surface of the groove GR corresponding thereto. Here, an uppermost surface 153*u* of the first metal layer 153 may be arranged on substantially the same level as the upper surface ILu of the inorganic insulating layer IL or on a higher level than the upper surface ILu of the inorganic insulating layer IL. In this specification, that "A and B are arranged on substantially the same level as each other" indicates that a vertical distance from an upper surface of the substrate 100 to A is substantially the same as a vertical distance from the upper surface of the substrate 100 to B within an error range, and that "A is arranged on a higher level than B" indicates that the vertical distance from the upper surface of the substrate 100 to A is greater than the vertical distance from the upper surface of the substrate 100 to B.

The separators SP may have tips PT protruding in a direction (a +z direction) crossing the upper surface ILu of the inorganic insulating layer IL. For example, both side edges of the second metal layer 155 of the first separator SP1 may be bent in the direction (the +z direction) crossing the upper surface ILu of the inorganic insulating layer IL to form a first tip PT1 and a second tip PT2. In a plan view, the first tip PT1 and the second tip PT2 protruding toward the upper surface ILu of the inorganic insulating layer IL may be spaced apart from each other. Likewise, both side edges of the second metal layer 155 of the second separator SP2 may be bent in the direction (the +z direction) crossing the upper surface ILu of the inorganic insulating layer IL to form a third tip PT3 and a fourth tip PT4. In a plan view, the third tip PT3 and the fourth tip PT4 protruding toward the upper surface ILu of the inorganic insulating layer IL may be spaced apart from each other.

Each of a distance between the first tip PT1 and the second tip PT2 and a distance between the third tip PT3 and the fourth tip PT4 may be determined by a width GRw of the corresponding groove GR. For example, each of the first tip PT1, the second tip PT2, the third tip PT3, and the fourth tip PT4 may be spaced apart from the side wall of the corresponding groove GR by a first distance d1. Here, the first distance d1 may be substantially the same as or greater than a thickness t2 of the first metal layer 153. FIG. 6 illustrates that widths GRw of the grooves GR are the same as each other. However, according to another embodiment, widths of the grooves GR may be different from each other.

A protrusion height h1 of the tip PT from an end of the tip PT to an upper surface 153*u* of the first metal layer 153 may be greater than a sum t1 of a thickness of the first functional layer 221, a thickness of the second functional layer 223, and a thickness of the opposite electrode 230. Here, the protrusion height h1 of the tip PT may be greater than or equal to the thickness t2 of the first metal layer 153. The thickness t2 of the first metal layer 153 may be greater than the sum t1 of the thickness of the first functional layer 221, the thickness of the second functional layer 223, and the thickness of the opposite electrode 230. For example, the sum t1 of the thickness of the first functional layer 221, the thickness of the second functional layer 223, and the thickness of the opposite electrode 230 may be about 3000 Å to about 4000 Å, and the thickness t2 of the first metal layer 153 may be about 5,000 Å to about 10,000 Å.

The first functional layer 221, the second functional layer 223, and the opposite electrode 230 may have disconnected portions due to the tips PT. For example, the first functional layer 221 and the second functional layer 223 may respectively include first portions 221*a* and 223*a* arranged on the second metal layer 155 of the separator SP and second portions 221*b* and 223*b* disconnected from the first portions 221*a* and 223*a* due to the tips PT. Likewise, the opposite electrode 230 may include a first portion 230*a* arranged on the second metal layer 155 of the separator SP and a second portion 230*b* disconnected from the first portion 230*a* due to the tips PT. Each of the first portion 221*a* of the first functional layer 221, the first portion 223*a* of the second functional layer 223, and the first portion 230*a* of the opposite electrode 230 may be arranged on a surface of the second metal layer 155 to cover the tip PT of the second metal layer 155, and each of the second portion 221*b* of the first functional layer 221, the second portion 223*b* of the second functional layer 223, and the second portion 230*b* of the opposite electrode 230 may directly contact side surface of the tip PT of the second metal layer 155.

The first and second functional layers 221 and 223 including an organic material are disconnected in the intermediate area IA, and thus, impurities, such as water, etc., introduced through the via-hole 100H of the substrate 100 may be prevented from introducing to the organic light-emitting diode OLED through the first and second functional layers 221 and 223.

The tips PT may extend in the direction crossing the upper surface ILu of the inorganic insulating layer IL and may be spaced apart from the inorganic insulating layer IL not to contact the inorganic insulating layer IL. For example, the second tip PT2 of the first separator SP1 may be separated from the upper surface ILu of the inorganic insulating layer IL by forming a first angle θ1 with an upper surface of the substrate 100. Here, the first angle θ1 may be about 70 degrees to about 90 degrees.

According to a comparative example, tips of a separator are horizontally arranged with respect to an upper surface of a substrate such that the separator has an eaves structure, thus a dead space where an image is not displayed may be expanded in order to secure a horizontal length of the tip. However, the tips PT of the separator SP according to embodiments may be arranged approximately perpendicularly to the upper surface of the substrate 100, and thus, a width of the intermediate area IA, which is a dead space, may be reduced. Also, an aperture may not be formed in a lower surface of the tip PT, and thus, defects which may occur in the display panel 10 during a manufacturing process may be reduced.

Referring to FIGS. 6 and 7, the encapsulation layer 300 may extend to the intermediate area IA. The first inorganic encapsulation layer 310 may have a relatively excellent step coverage, and thus, may entirely and continually overlap the separator SP. For example, the first inorganic encapsulation layer 310 may continually extend to overlap an inner surface, an upper surface, and an outer surface of the tip PT of the separator SP.

The partition wall PW may be arranged in the intermediate area IA. As described above with reference to FIG. 5, the partition wall PW may have a closed-loop shape in a plan view. The partition wall PW may control a flow of materials used for forming the organic encapsulation layer 320. Thus, an edge of the organic encapsulation layer 320 may be disposed adjacent to the partition wall PW.

Some of the separators SP may overlap the organic encapsulation layer 320. For example, the separators SP arranged in the first area A1 between the organic light-emitting diode OLED in the display area DA and the partition wall PW may overlap the organic encapsulation layer 320. The organic encapsulation layer 320 may not be arranged on the separators SP arranged in the second area A2 between the partition wall PW and the via-hole 100H of the substrate 100. The first inorganic encapsulation layer 310 and the second inorganic encapsulation layer 330 may contact each other on the separators SP arranged in the second area A2.

Figure 8:
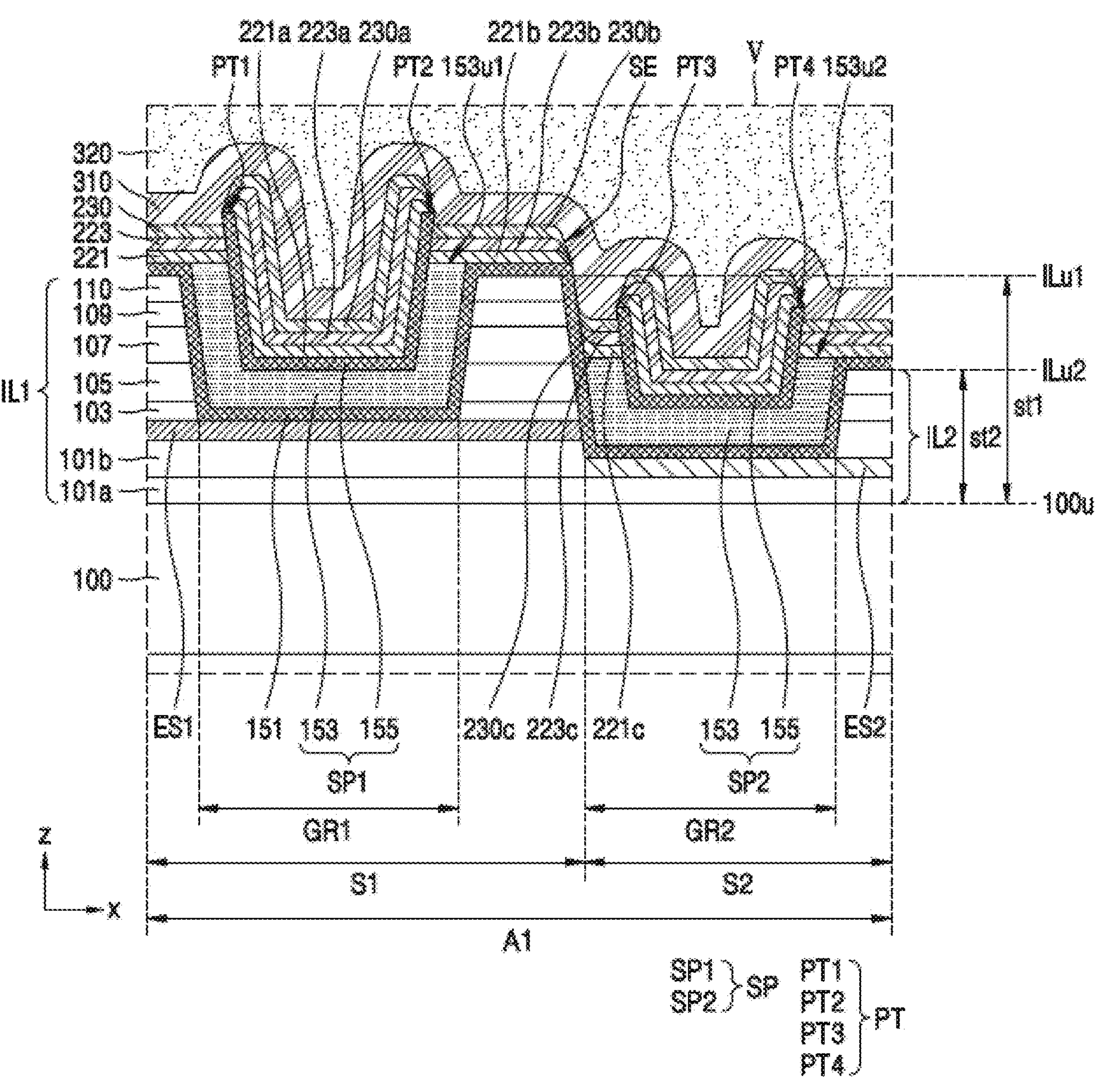
FIG. 8 is a cross-sectional view of a portion taken from a display panel according to another embodiment.

FIG. 8 is a cross-sectional view of a portion taken from a display panel and indicated by region V of FIG. 6 according to another embodiment. FIG. 8 illustrates a structure of the separators SP arranged in the first area A1 between the display area DA and the partition wall PW. However, the separators SP arranged in the second area A2 between the partition wall PW and the opening area OA may also have the same structure.

Referring to FIG. 8, the first area A1 may include a first sub-area S1 and a second sub-area S2. A first inorganic insulating layer IL1 may be arranged in the first sub-area S1, and a second inorganic insulating layer IL2 may be arranged in the second sub-area S2. Each of the first inorganic insulating layer IL1 and the second inorganic insulating layer IL2 may include at least some layers of the inorganic insulating layer IL (see FIG. 6) extending from the display area DA (see FIG. 6) to the intermediate area IA (see FIG. 6). With respect to this aspect, FIG. 8 illustrates that the first inorganic insulating layer IL1 includes the first buffer layer 101*a*, the second buffer layer 101*b*, the first gate insulating layer 103, the first interlayer insulating layer 105, the second interlayer insulating layer 107, the second gate insulating layer 109, and the third interlayer insulating layer 110, and the second inorganic insulating layer IL2 includes the first buffer layer 101*a*, the second interlayer insulating layer 107, the second gate insulating layer 109, and the third interlayer insulating layer 110. However, the configuration of the first inorganic insulating layer IL1 and the second inorganic insulating layer IL2 is not limited thereto.

An upper surface ILu1 of the first inorganic insulating layer IL1 and an upper surface ILu2 of the second inorganic insulating layer IL2 may be arranged on different levels from each other. For example, as illustrated in FIG. 8, a thickness st1 of the first inorganic insulating layer IL1, which is a distance from an upper surface 100*u* of the substrate 100 to the upper surface ILu1 of the first inorganic insulating layer IL1, may be greater than a thickness st2 of the second inorganic insulating layer IL2, which is a distance from the upper surface 100*u* of the substrate 100 to the upper surface ILu2 of the second inorganic insulating layer IL2.

A first etch stopper ES1 may be arranged in the first sub-area S1, and a second etch stopper ES2 may be arranged in the second sub-area S2. As described with reference to FIG. 6, each of the first and second etch stoppers ES1 and ES2 may be arranged on the same layer as the bottom metal layer BML, the first semiconductor layer Act1 of the first thin-film transistor TFT1, the first gate electrode G1 of the first thin-film transistor TFT1, the second semiconductor layer Act2 of the second thin-film transistor TFT2, or the upper gate electrode G3*b* of the second thin-film transistor TFT2. With respect to this aspect, FIG. 8 illustrates that the first etch stopper ES1 may be arranged on the same layer as the first semiconductor layer Act1 of the first thin-film transistor TFT1, and the second etch stopper ES2 may be arranged on the same layer as the bottom metal layer BML. Here, the first etch stopper ES1 may include the same material as the first semiconductor layer Act1 of the first thin-film transistor TFT1, and the second etch stopper ES2 may include the same material as the bottom metal layer BML.

The first inorganic insulating layer IL1 may define a first groove GR1 arranged in the first sub-area S1, and the second inorganic insulating layer IL2 may define a second groove GR2 arranged in the second sub-area S2. The second groove GR2 may be arranged to be adjacent to a boundary SE of the first and second sub-areas S1 and S2. In other words, the first inorganic insulating layer IL1 may form a side wall of the second groove GR2, and the second inorganic insulating layer IL2 may form the other side wall of the second groove GR2. Thus, the upper surface ILu1 of the first inorganic insulating layer IL1 and the upper surface ILu2 of the second inorganic insulating layer IL2 may be arranged on the different levels from each other with the second groove GR2 disposed therebetween.

The first sub-metal layer 151 may be arranged to cover the upper surface ILu1 of the first inorganic insulating layer IL1, a side wall and a bottom surface of the first groove GR1, the upper surface ILu2 of the second inorganic insulating layer IL2, and a side wall and a bottom surface of the second groove GR2. The first sub-metal layer 151 may include a conductive material. Here, the conductive material may include metal and/or transparent conductive oxide. For example, the first sub-metal layer 151 may include at least one selected from Ti, Mo, and W. According to another embodiment, the first sub-metal layer 151 may include a transparent conductive oxide, such as ITO. According to some embodiments, the first sub-metal layer 151 may be omitted.

The separators SP may be arranged on the first sub-metal layer 151. For example, the first separator SP1 may be arranged to correspond to the first groove GR1, and the second separator SP2 may be arranged to correspond to the second groove GR2.

Each of the first and second separators SP1 and SP2 may include the first metal layer 153 and the second metal layer 155 arranged on the first metal layer 153. Each of the first and second metal layers 153 and 155 may include a conductive material. The first metal layer 153 may include the conductive material different from the conductive material included in the first sub-metal layer 151 and the second metal layer 155.

According to some embodiments, the first metal layer 153 may include metal. For example, the first metal layer 153 may include at least one selected from Cu, Al, Pt, Pd, Ag, Mg, Au, Ni, Nb, Ir, Cr, Li, Ca, and Mo.

The second metal layer 155 may include metal and/or transparent conductive oxide. The second metal layer 155 may include at least one selected from Ti, Mo, and W. According to another embodiment, the second metal layer 155 may include a transparent conductive oxide, such as ITO. According to some embodiments, the second metal layer 155 may include the same material as the first sub-metal layer 151.

According to some embodiments, the first sub-metal layer 151 and the separators SP may be formed together in the same process as any one of the connection electrode CM and the data line DL described with reference to FIG. 6. For example, when the first sub-metal layer 151 and the first metal layer 153 and the second metal layer 155 of the separators SP form a tri-layered structure, the connection electrode CM or the data line DL may also have a tri-layered structure. According to another embodiment, when the first sub-metal layer 151 is omitted, the connection electrode CM or the data line DL may have a bi-layered structure.

The first metal layer 153 of the first separator SP1 may be formed to have a predetermined thickness along the side wall and the bottom surface of the first groove GR1, and the first metal layer 153 of the second separator SP2 may be formed to have a predetermined thickness along the side wall and the bottom surface of the second groove GR2. Here, an uppermost surface 153*u*1 of the first metal layer 153 of the first separator SP1 may be on a level the same as or similar to a level of the upper surface ILu1 of the first inorganic insulating layer IL1. Here, an uppermost surface 153*u*2 of the first metal layer 153 of the second separator SP2 may be on a level the same as or similar to a level of the upper surface ILu2 of the second inorganic insulating layer IL2.

At the boundary SE of the first and second sub-areas S1 and S2, the upper surface ILu1 of the first inorganic insulating layer IL1 and the uppermost surface 153*u*2 of the first metal layer 153 of the second separator SP2 may have a step different in a direction perpendicular to the substrate 100. Due to the step difference, the first functional layer 221, the second functional layer 223, and the opposite electrode 230 may have disconnected portions spaced apart from each other at the boundary SE of the first and second sub-areas S1 and S2. For example, the first functional layer 221 and the second functional layer 223 may respectively include second portions 221*b* and 223*b* arranged on the first inorganic insulating layer IL1 and third portions 221*c* and 223*c* arranged on the uppermost surface 153*u*2 of the first metal layer 153 of the second separator SP2. Likewise, the opposite electrode 230 may include a second portion 230*b* arranged on the first inorganic insulating layer IL1 and a third portion 230*c* arranged on the uppermost surface 153*u*2 of the first metal layer 153 of the second separator SP2.

According to some embodiments, a sub-tip (not shown) protruding from the upper surface ILu1 of the first inorganic insulating layer IL1 may be arranged at the boundary SE of the first and second sub-areas S1 and S2. The sub-tip may be formed due to a difference between a vertical etch rate and a horizontal etch rate in a process of forming the first and second separators SP1 and SP2. The sub-tip may separate the first functional layer 221, the second functional layer 223, and the opposite electrode 230 at the boundary SE of the first and second sub-areas S1 and S2.

Both side edges of the second metal layer 155 of the first separator SP1 may be bent in a direction (a +z direction) crossing the upper surface ILu1 of the first inorganic insulating layer IL1 to form a first tip PT1 and a second tip PT2. In a plan view, the first tip PT1 and the second tip PT2 protruding toward the upper surface ILu1 of the first inorganic insulating layer IL1 may be spaced apart from each other. Likewise, both side edges of the second metal layer 155 of the second separator SP2 may be bent in a direction (the +z direction) crossing the upper surface ILu2 of the second inorganic insulating layer IL2 to form a third tip PT3 and a fourth tip PT4. In a plan view, the third tip PT3 and the fourth tip PT4 protruding toward the upper surface ILu2 of the second inorganic insulating layer IL2 may be spaced apart from each other.

The first functional layer 221, the second functional layer 223, and the opposite electrode 230 may have disconnected portions spaced apart from each other due to the tips PT. For example, the first functional layer 221 and the second functional layer 223 may respectively include the first portions 221*a* and 223*a* arranged on the second metal layer 155 of the separator SP and the second portions 221*b* and 223*b* disconnected from the first portions 221*a* and 223*a* due to the tips PT. As described above, the second portions 221*b* of the first functional layer 221 and the second portion 223*b* of the second functional layer 223 may respectively be disconnected from the third portions 221*c* and 223*c* due to the step difference between the upper surface ILu1 of the first inorganic insulating layer IL1 and the uppermost surface 153*u*2 of the first metal layer 153 of the second separator SP2. Likewise, the opposite electrode 230 may include the first portion 230*a* arranged on the second metal layer 155 of the separator SP and the second portion 230*b* disconnected from the first portion 230*a* due to the tips PT.

The first and second functional layers 221 and 223 including an organic material are separated in the intermediate area IA, and thus, impurities, such as water, etc., introduced through the via-hole 100H of the substrate 100, may be prevented from reaching to the organic light-emitting diode OLED through the first and second functional layers 221 and 223.

Figure 9A:
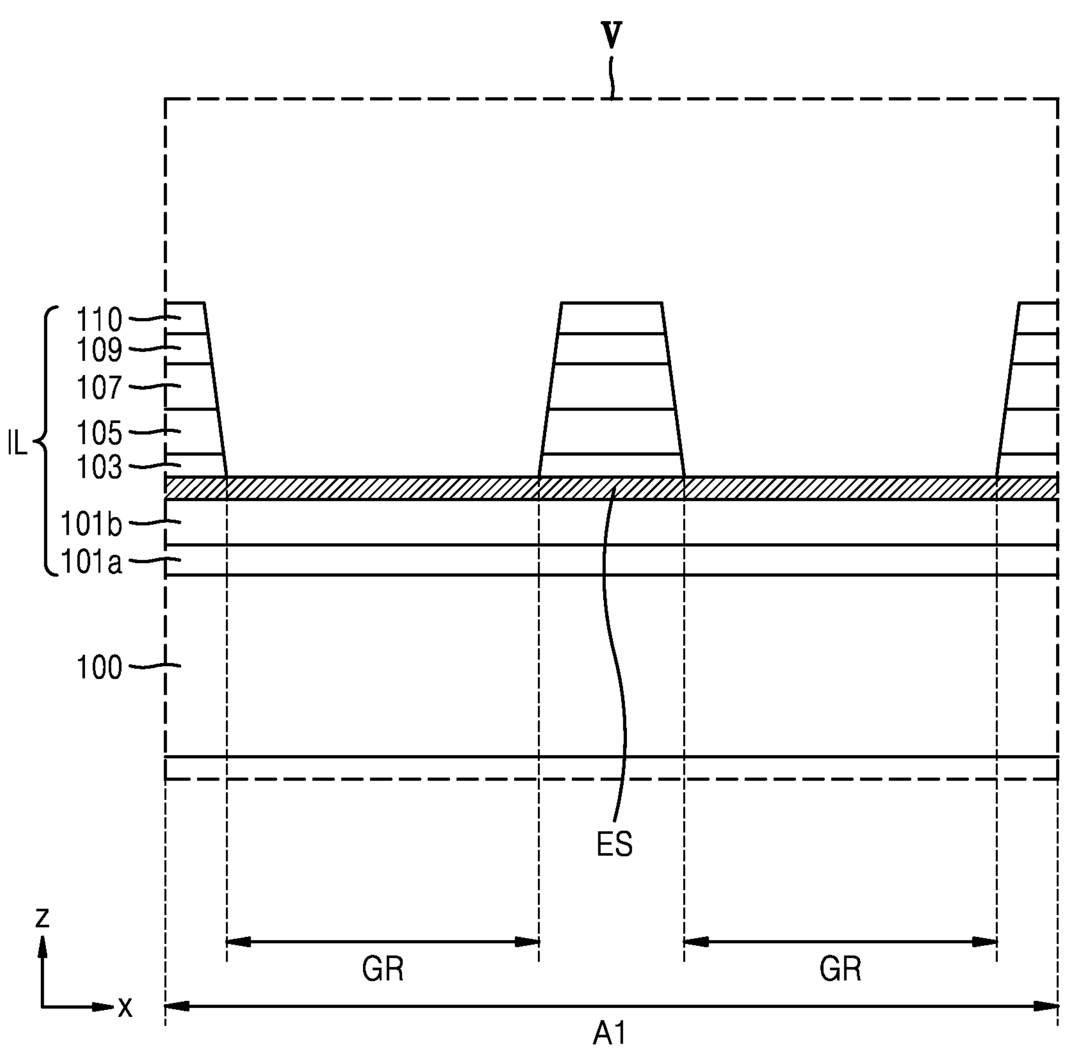
FIGS. 9A, 9B and 9C are schematic cross-sectional views for describing a process of forming a separator, the process being included in a manufacturing process of a display panel according to an embodiment.
Figure 9B:
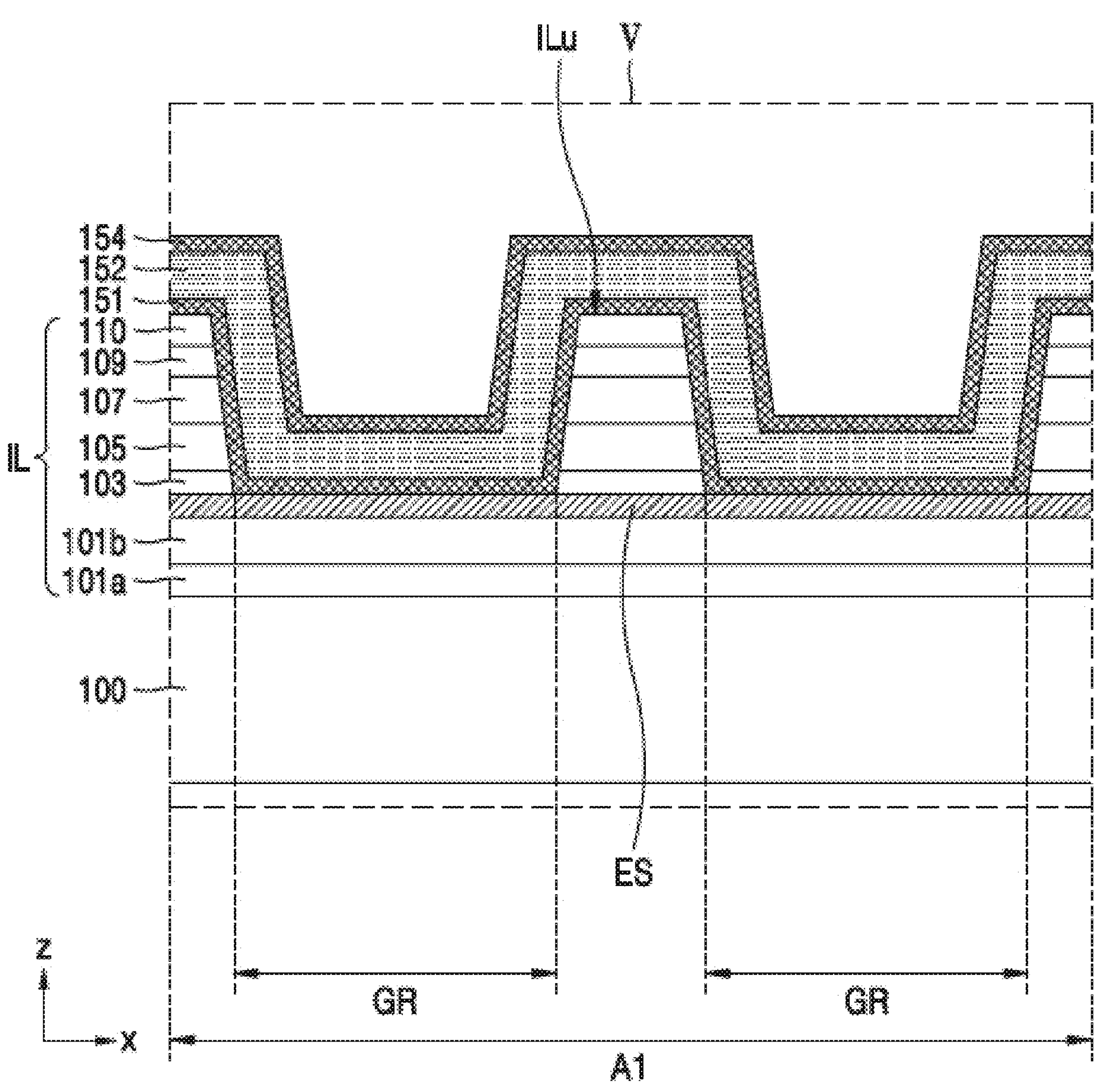
Figure 9C:
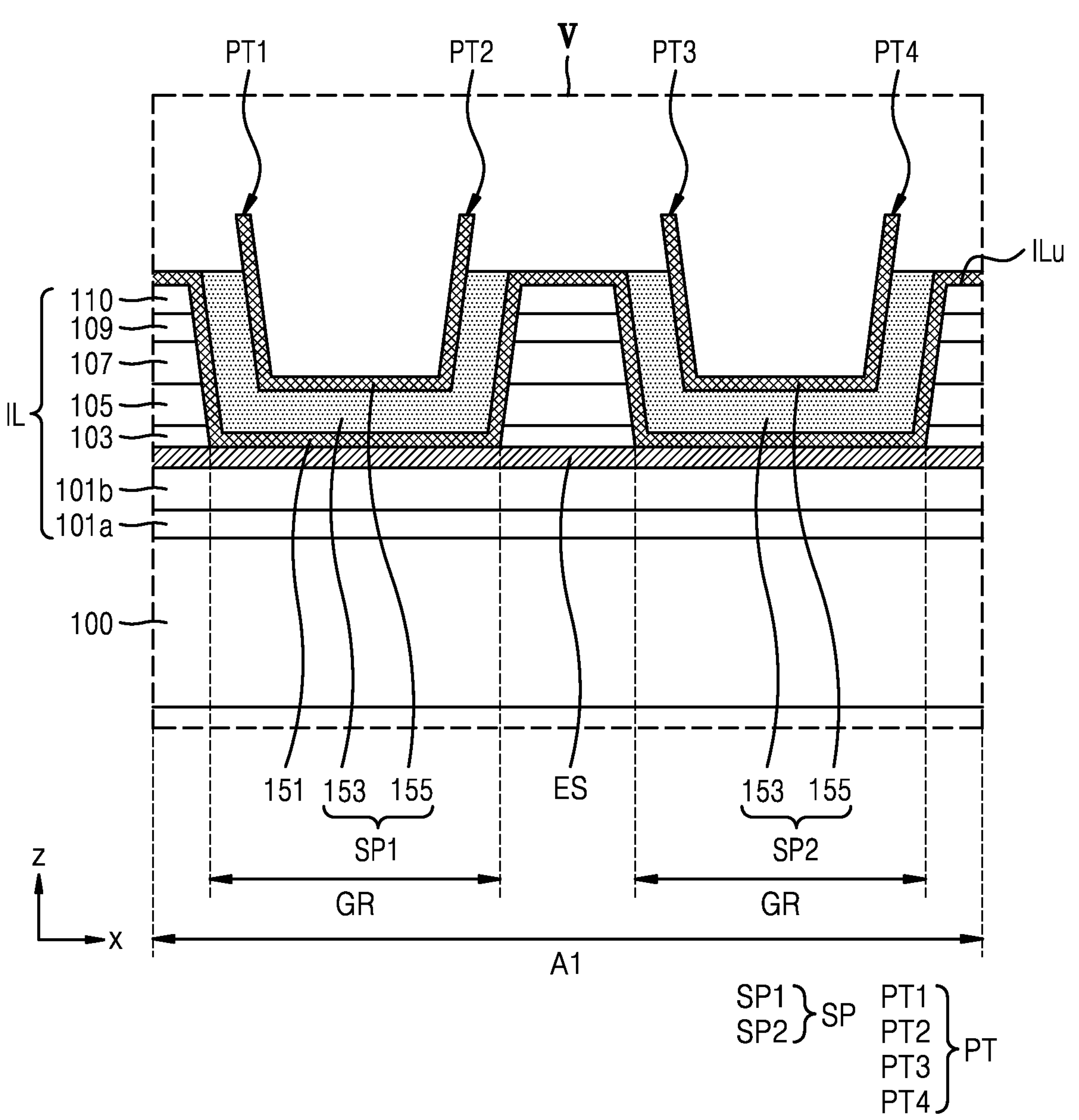

FIGS. 9A to 9C are schematic cross-sectional views for describing a process of forming a separator, the process being included in a manufacturing process of a display panel according to an embodiment.

Referring to FIG. 9A, the inorganic insulating layer IL having the grooves GR may be formed in the first area A1 of the intermediate area IA. The grooves GR may be formed by etching a portion of the inorganic insulating layer IL and may be spaced apart from each other. According to an embodiment, the etch stopper ES may be arranged in the first area A1. Here, a depth of the groove GR may be determined by a thickness of the inorganic insulating layer IL and a position of the etch stopper ES.

For example, the inorganic insulating layer IL may include the first buffer layer 101*a*, the second buffer layer 101*b*, the first gate insulating layer 103, the first interlayer insulating layer 105, the second interlayer insulating layer 107, the second gate insulating layer 109, and the third interlayer insulating layer 110. The etch stopper ES may be arranged between the second buffer layer 101*b* and the first gate insulating layer 103. The grooves GR having the etch stopper ES as a bottom surface thereof may be formed by etching portions of the first gate insulating layer 103, the first interlayer insulating layer 105, the second interlayer insulating layer 107, the second gate insulating layer 109, and the third interlayer insulating layer 110.

According to some embodiments, the inorganic insulating layer IL may also include, as illustrated in FIG. 8, the first inorganic insulating layer IL1 and the second inorganic insulating layer IL2, the upper surfaces of which have different heights from each other.

Referring to FIG. 9B, the first sub-metal layer 151, a second sub-metal layer 152, and a third sub-metal layer 154 may be sequentially formed to cover the upper surface ILu of the inorganic insulating layer IL and side walls and the bottom surfaces of the grooves GR. According to some embodiments, the first sub-metal layer 151 may be omitted.

Each of the first to third sub-metal layers 151, 152, and 154 may include a conductive material. The second sub-metal layer 152 may include the conductive material different from the conductive material included in the first sub-metal layer 151 and/or the third sub-metal layer 154.

According to some embodiments, the second sub-metal layer 152 may include a metal material. For example, the second sub-metal layer 152 may include at least one selected from Cu, Al, Pt, Pd, Ag, Mg, Au, Ni, Nb, Ir, Cr, Li, Ca, and Mo.

The first sub-metal layer 151 and/or the third sub-metal layer 154 may include metal and/or transparent conductive oxide. According to an embodiment, the first sub-metal layer 151 and/or the third sub-metal layer 154 may include at least one selected from Ti, Mo, and W. According to another embodiment, the first sub-metal layer 151 and/or the third sub-metal layer 154 may include a transparent conductive oxide, such as ITO. According to some embodiments, the third sub-metal layer 154 may include the same material as the first sub-metal layer 151.

According to some embodiments, the first to third sub-metal layers 151, 152, and 154 may be formed together in the same process as any one of the connection electrode CM, the data line DL or the pixel electrode 210 described with reference to FIG. 6.

Thereafter, as illustrated in FIG. 9C, the separators SP having the tips PT protruding in the direction (the +z direction) crossing the upper surface ILu of the inorganic insulating layer IL may be formed by etching portions of the second sub-metal layer 152 and the third sub-metal layer 154. A vertical etch selectivity and a horizontal etch selectivity may be different from each other, and thus, a portion of the third sub-metal layer 154 in a direction parallel with the upper surface ILu of the inorganic insulating layer IL may be removed, and a portion of the third sub-metal layer 154 in the direction (the +z direction) crossing the upper surface ILu of the inorganic insulating layer IL may remain to form the tips PT.

Thereafter, the second sub-metal layer 152 having a different selectivity from the third sub-metal layer 154 may be additionally etched through a subsequent process, and thus, the first separator SP1 and the second separator SP2 each including the first metal layer 153 and the second metal layer 155 including tips PT1, PT2, PT3 and PT4 may be formed.

Both side edges of the second metal layer 155 of the first separator SP1 may be bent in the direction (the +z direction) crossing the upper surface ILu of the inorganic insulating layer IL to form the first tip PT1 and the second tip PT2. Likewise, both side edges of the second metal layer 155 of the second separator SP2 may be bent in the direction (the +z direction) crossing the upper surface ILu of the inorganic insulating layer IL to form the third tip PT3 and the fourth tip PT4. In a plan view, the third tip PT3 and the fourth tip PT4 protruding toward the upper surface ILu of the inorganic insulating layer IL may be apart from each other. A protrusion height of the tips PT may be determined by a thickness of the second sub-metal layer 152.

Figure 10:
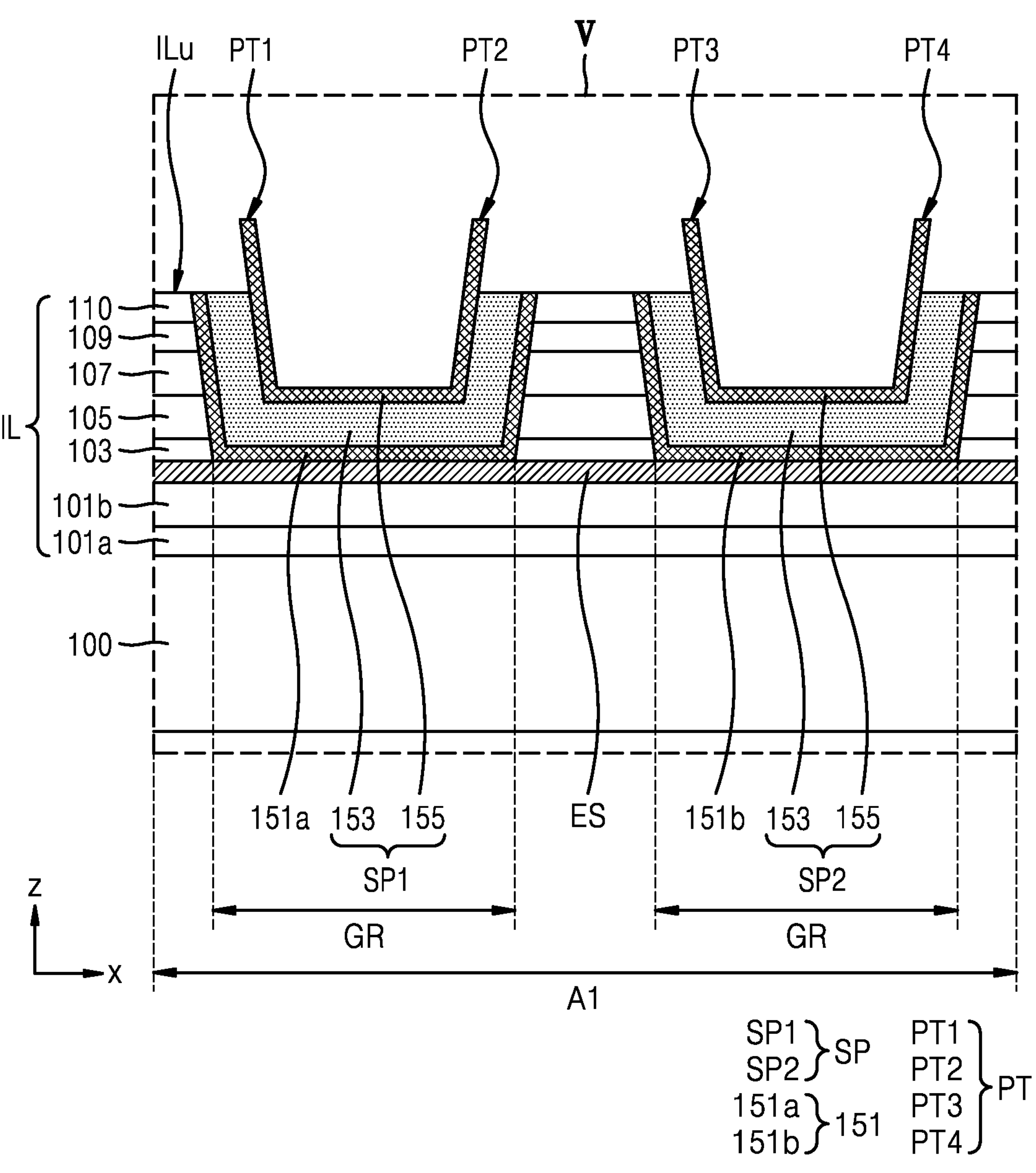
FIGS. 10 and 11 are schematic cross-sectional views of separators according to embodiments.
Figure 11:
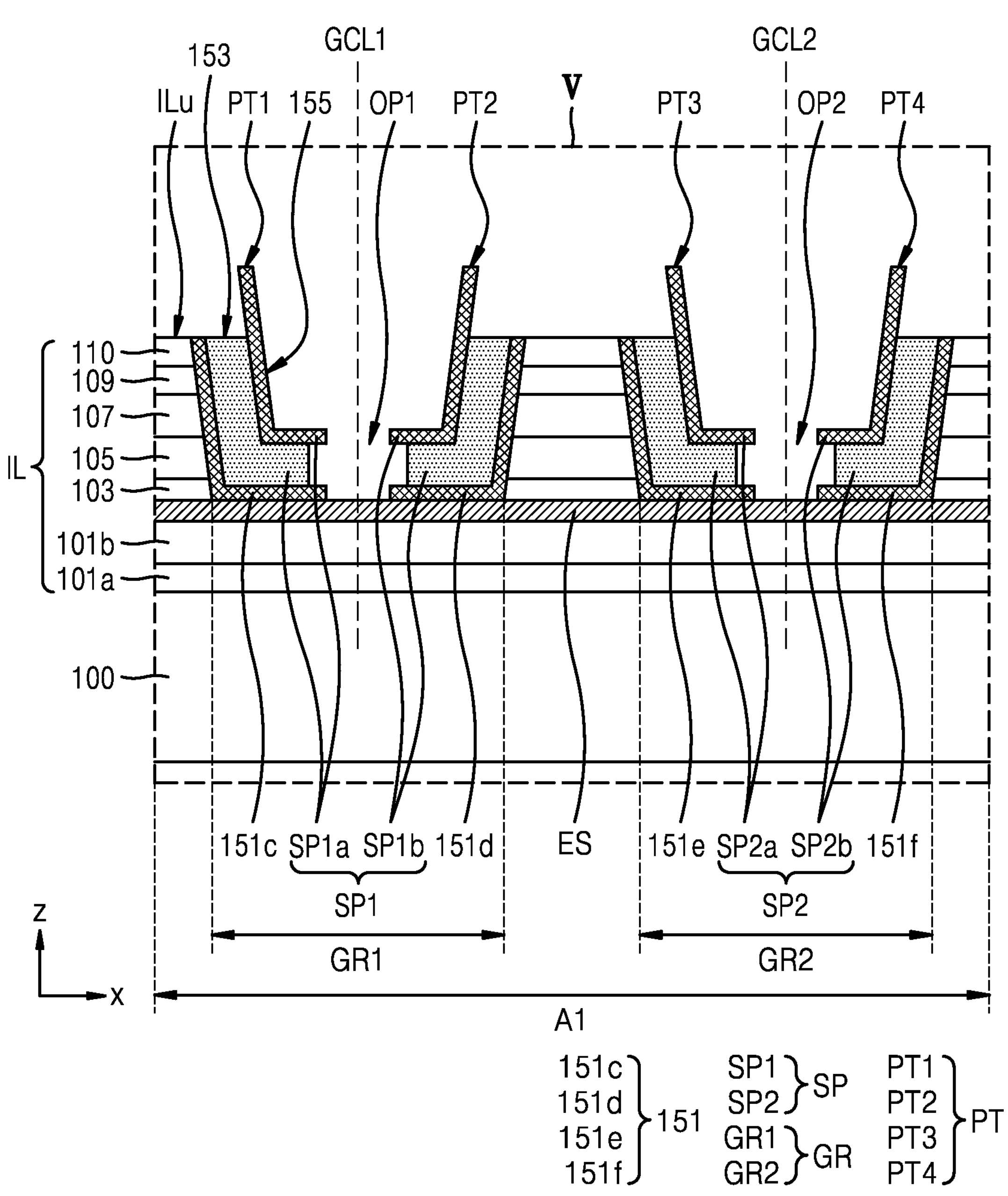

FIGS. 10 and 11 are schematic cross-sectional views of the separators SP according to embodiments.

Referring to FIG. 10, one or more grooves GR surrounding the opening area OA (see FIG. 6) may be arranged in the first area A1. The groove GR may denote an area where a portion of the inorganic insulating layer IL is removed in a lower direction (a −z direction, for example, a thickness direction), and the other portions of the inorganic insulating layer IL remain. FIG. 10 illustrates that portions of the first gate insulating layer 103, the first interlayer insulating layer 105, the second interlayer insulating layer 107, the second gate insulating layer 109, and the third interlayer insulating layer 110 may be removed to form the groove GR which includes side surfaces and a bottom surface which is a top surface of the etch stopper ES. In a plan view, the grooves GR may have a closed-loop shape and may be arranged to be spaced apart from each other.

The first sub-metal layer 151 may be arranged in the first area A1 to cover side surfaces and the bottom surface of the groove GR. The first sub-metal layer 151 may be arranged only on the side surfaces and the bottom surface of the groove GR and may not be arranged on the upper surface ILu of the inorganic insulating layer IL. That is, a portion of the first sub-metal layer 151 on the upper surface ILu of the inorganic insulating layer IL may be removed, and thus, the first sub-metal layer 151 may be separated into a 1-1$^{st}$ sub-metal layer 151*a* arranged between the first separator SP1 and the inorganic insulating layer IL and a 1-2$^{nd}$ sub-metal layer 151*b* arranged between the second separator SP2 and the inorganic insulating layer IL.

The separators SP may have tips PT protruding in a direction (a +z direction) crossing the upper surface ILu of the inorganic insulating layer IL. For example, both side edges of the second metal layer 155 of the first separator SP1 may be bent in the direction (the +z direction) crossing the upper surface ILu of the inorganic insulating layer IL to form the first tip PT1 and the second tip PT2. In a plan view, the first tip PT1 and the second tip PT2 protruding toward the upper surface ILu of the inorganic insulating layer IL may be spaced apart from each other. Likewise, both side edges of the second metal layer 155 of the second separator SP2 may be bent in the direction (the +z direction) crossing the upper surface ILu of the inorganic insulating layer IL to form the third tip PT3 and the fourth tip PT4. In a plan view, the third tip PT3 and the fourth tip PT4 protruding toward the upper surface ILu of the inorganic insulating layer IL may be spaced apart from each other.

Referring to FIG. 11, the first sub-metal layer 151 may be arranged in the first area A1 to cover the side surfaces and the bottom surface of the groove GR. The first sub-metal layer 151 may be arranged only on the side surface and the bottom surface of the groove GR and may not be arranged on the upper surface ILu of the inorganic insulating layer IL.

The first sub-metal layer 151 and the first separator SP1 may define a first opening OP1 arranged along a central line GCL1 of the first groove GR1. For example, the first opening OP1 may penetrate the first sub-metal layer 151, and the first metal layer 153 (see FIG. 10) and the second metal layer 155 (see FIG. 10) of the first separator SP1. Likewise, the first sub-metal layer 151 and the second separator SP2 may define a second opening OP2 arranged along a central line GCL2 of the second groove GR2. For example, the second opening OP2 may penetrate the first sub-metal layer 151, and the first metal layer 153 (see FIG. 10) and the second metal layer 155 (see FIG. 10) of the second separator SP2.

In a plan view, the first groove GR1 and the second groove GR2 may be spaced apart from each other forming a concentric circle, and thus, the first opening OP1 and the second opening OP2 may also be spaced apart from each other forming a concentric circle.

The first sub-metal layer 151 may be separated into a 1-3$^{rd}$ sub-metal layer 151*c* and a 1-4$^{th}$ sub-metal layer 151*d* in the first groove GR1 due to the first opening OP1. The 1-3$^{rd}$ sub-metal layer 151_c_ and the 1-4$^{th}$ sub-metal layer 151_d_ may be spaced apart from each other. The first separator SP1 may be separated into a 1-1$^{st}$ separator SP1_a_ and a 1-2$^{nd}$ separator SP1_b_ due to the first opening OP1. The 1-1$^{st}$ separator SP1_a_ and the 1-2$^{nd}$ separator SP1_b_ may be spaced apart from each other. Here, a side surface of the first opening OP1 may have an undercut structure such that the second metal layer 155 protrudes from the first metal layer 153.

The first sub-metal layer 151 may be separated into a 1-5$^{th}$ sub-metal layer 151_e_ and 1-6$^{th}$ sub-metal layer 151_f_ in the second groove GR2 due to the second opening OP2. The 1-5$^{th}$ sub-metal layer 151_e_ and the 1-6$^{th}$ sub-metal layer 151_f_ may be spaced apart from each other. The second separator SP2 may be separated into a 2-1$^{st}$ separator SP2_a_ and a 2-2$^{nd}$ separator SP2_b_ due to the second opening OP2. The 2-1$^{st}$ separator SP2_a_ and the 2-2$^{nd}$ separator SP2_b_ may be spaced apart from each other. Here, a side surface of the second opening OP2 may have an undercut structure such that the second metal layer 155 protrudes from the first metal layer 153.

Thus, the first functional layer 221 (see FIG. 6), the second functional layer 223 (see FIG. 6), and the opposite electrode 230 (see FIG. 6) may be disconnected due to the undercut structure formed at the side surface of the first opening OP1 and the undercut structure formed at the side surface of the second opening OP2. The first functional layer 221 and the second functional layer 223 may be disconnected due to the first opening OP1 and the second opening OP2, and thus, the introduction of impurities, such as water, etc., introduced through the via-hole 100H (see FIG. 6) of the substrate 100 to the organic light-emitting diode OLED through the first and second functional layers 221 and 223 may be prevented or reduced.

Therefore, according to the display panel according to embodiments, the separators SP for disconnecting the functional layer may be formed without an additional process except for a process of forming the pixel circuit PC (see FIG. 6), the signal lines and the organic light-emitting diode OLED (see FIG. 6).

As described above, according to the one or more of the above embodiments of the disclosure, the display panel including the display area in which various types of components are arranged and having improved reliability and the electronic apparatus including the display panel may be realized. However, the scope of the disclosure is not limited to these effects as described above.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
- a substrate comprising an opening area, a display area surrounding at least a portion of the opening area, and an intermediate area disposed between the opening area and the display area;
- a light-emitting diode arranged in the display area and comprising a pixel electrode, an opposite electrode, and an intermediate layer disposed between the pixel electrode and the opposite electrode;
- an inorganic insulating layer arranged in the intermediate area and defining a groove surrounding the opening area; and
- a separator arranged in the intermediate area and comprising a first metal layer arranged in the groove and a second metal layer arranged on the first metal layer and having a tip protruding in a direction crossing an upper surface of the inorganic insulating layer.

2. The display panel of claim 1, wherein the intermediate layer comprises an emission layer arranged to correspond to the pixel electrode and a functional layer extending from the display area to the intermediate area, and
- wherein a protrusion height of the tip protruding from an upper surface of the first metal layer is greater than a sum of a thickness of the functional layer and a thickness of the opposite electrode.

3. The display panel of claim 2, wherein the functional layer comprises a first portion overlapping the second metal layer and a second portion disconnected from the first portion.

4. The display panel of claim 2, wherein a thickness of the first metal layer is greater than the sum of the thickness of the functional layer and the thickness of the opposite electrode.

5. The display panel of claim 1, wherein the opposite electrode comprises: a first portion overlapping the second metal layer and a second portion disconnected from the first portion.

6. The display panel of claim 1, further comprising a sub-metal layer arranged between the inorganic insulating layer and the separator.

7. The display panel of claim 6, wherein the sub-metal layer covers at least a portion of the upper surface of the inorganic insulating layer, in the intermediate area.

8. The display panel of claim 6, wherein the sub-metal layer is arranged only on a side surface and a bottom surface of the groove.

9. The display panel of claim 8, further comprising an opening arranged along a central line of the groove and formed through the sub-metal layer, the first metal layer, and the second metal layer.

10. The display panel of claim 1, wherein the tip comprises a first tip and a second tip separated from the first tip when viewed in a direction perpendicular to the substrate.

11. The display panel of claim 1, wherein the tip forms a first angle with an upper surface of the substrate and the first angle is from 70 degrees to 90 degrees.

12. The display panel of claim 1, further comprising an etch stopper arranged between the substrate and the separator and forming a bottom surface of the groove.

13. The display panel of claim 1, wherein the groove and the separator are provided in plural,
- wherein the intermediate area comprises a first sub-area and a second sub-area,
- wherein the inorganic insulating layer comprises a first inorganic insulating layer arranged in the first sub-area and having a first groove and a second inorganic insulating layer arranged in the second sub-area and having a second groove, and
- wherein a first height from an upper surface of the substrate to an upper surface of the first inorganic insulating layer is different from a second height from the upper surface of the substrate to an upper surface of the second inorganic insulating layer.

14. The display panel of claim 13, wherein a boundary of the second groove is arranged to overlap a boundary between the first sub-area and the second sub-area.

15. An electronic apparatus comprising:

a display panel comprising an opening area, a display area surrounding at least a portion of the opening area, and an intermediate area disposed between the opening area and the display area; and a component arranged to overlap the opening area of the display panel, wherein the display panel comprises:

a substrate;

a light-emitting diode arranged on the substrate to overlap the display area and comprising a pixel electrode, an opposite electrode, and an intermediate layer disposed between the pixel electrode and the opposite electrode;

an inorganic insulating layer arranged on the substrate to overlap the intermediate area and defining a groove surrounding the opening area; and a separator arranged on the substrate to overlap the intermediate area and comprising a first metal layer arranged in the groove and a second metal layer arranged on the first metal layer and having a tip protruding in a direction crossing an upper surface of the inorganic insulating layer.

16. The electronic apparatus of claim 15, wherein the intermediate layer comprises an emission layer arranged to correspond to the pixel electrode and a functional layer extending from the display area to the intermediate area, and wherein a protrusion height of the tip protruding from an upper surface of the first metal layer is greater than a sum of a thickness of the functional layer and a thickness of the opposite electrode.

17. The electronic apparatus of claim 16, wherein a thickness of the first metal layer is greater than the sum of the thickness of the functional layer and the thickness of the opposite electrode.

18. The electronic apparatus of claim 16, wherein the functional layer comprises: a first portion overlapping the second metal layer and a second portion disconnected from the first portion.

19. The electronic apparatus of claim 15, further comprising a sub-metal layer arranged between the inorganic insulating layer and the separator.

20. The electronic apparatus of claim 19, wherein the sub-metal layer covers at least a portion of the upper surface of the inorganic insulating layer, in the intermediate area.

21. The electronic apparatus of claim 19, wherein the sub-metal layer is arranged only on a side surface and a bottom surface of the groove.

22. The electronic apparatus of claim 19, further comprising an opening arranged along a central line of the groove and formed through the sub-metal layer, the first metal layer, and the second metal layer.

23. The electronic apparatus of claim 15, wherein the tip comprises a first tip and a second tip separated from the first tip when viewed in a direction perpendicular to the substrate.

24. The electronic apparatus of claim 15, wherein the tip forms a first angle with an upper surface of the substrate and the first angle is from 70 degrees to 90 degrees.

25. The electronic apparatus of claim 15, further comprising an etch stopper arranged between the substrate and the separator and forming a bottom surface of the groove.

26. The electronic apparatus of claim 15, wherein the groove and the separator are provided in plural, wherein the intermediate area comprises a first sub-area and a second sub-area, wherein the inorganic insulating layer comprises a first inorganic insulating layer arranged in the first sub-area and having a first groove and a second inorganic insulating layer arranged in the second sub-area and having a second groove, and wherein a first height from an upper surface of the substrate to an upper surface of the first inorganic insulating layer is different from a second height from the upper surface of the substrate to an upper surface of the second inorganic insulating layer.

* * * * *